US012613320B2

(12) United States Patent
Suga et al.

(10) Patent No.: US 12,613,320 B2
(45) Date of Patent: Apr. 28, 2026

(54) LIGHT SOURCE DEVICE AND DISTANCE MEASURING DEVICE

(71) Applicant: CANON KABUSHIKI KAISHA, Tokyo (JP)

(72) Inventors: Takako Suga, Kanagawa (JP); Takeshi Uchida, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 934 days.

(21) Appl. No.: 17/818,192

(22) Filed: Aug. 8, 2022

(65) Prior Publication Data

US 2023/0059270 A1 Feb. 23, 2023

(30) Foreign Application Priority Data

Aug. 19, 2021 (JP) ................................. 2021-134111

(51) Int. Cl.
| | |
|---|---|
| *G01S 7/4865* | (2020.01) |
| *G01S 7/481* | (2006.01) |
| *G01S 17/10* | (2020.01) |
| *G01S 17/931* | (2020.01) |
| *H01S 5/183* | (2006.01) |

(52) U.S. Cl.
CPC .......... *G01S 7/4865* (2013.01); *G01S 7/4814* (2013.01); *G01S 7/4816* (2013.01); *G01S 17/10* (2013.01); *G01S 17/931* (2020.01); *H01S 5/18361* (2013.01)

(58) Field of Classification Search
CPC ..... H01S 5/0264; H01S 5/18361; G01S 7/484
See application file for complete search history.

(56) References Cited

U.S. PATENT DOCUMENTS

| | | | | |
|---|---|---|---|---|
| 5,281,829 A | * | 1/1994 | Chinen | .................. H10H 29/10 257/466 |
| 9,124,070 B2 | | 9/2015 | Uchida | |
| 9,269,853 B2 | | 2/2016 | Suga | |

(Continued)

FOREIGN PATENT DOCUMENTS

| | | |
|---|---|---|
| JP | 61-172388 A | 8/1986 |
| JP | 11-511292 A | 9/1999 |

(Continued)

OTHER PUBLICATIONS

Japanese Office Action issued Aug. 21, 2025 during prosecution of related Japanese Application No. 2021-134111 (English-language machine translation included).

(Continued)

*Primary Examiner* — Yuqing Xiao
*Assistant Examiner* — Rachel Nguyen
(74) *Attorney, Agent, or Firm* — VENABLE LLP

(57) ABSTRACT

The disclosed light source device includes a light emitting element including a first reflector, a second reflector, and a resonator spacer portion provided between the first reflector and the second reflector and including an active layer, and emits a first light as a laser beam and a second light as a spontaneous emission light, a light receiving element that determines an amount of the second light, and a determination unit that determines a timing at which the first light oscillates based on a decrease in the amount of the second light determined by the light receiving element.

17 Claims, 19 Drawing Sheets

(56)           References Cited

U.S. PATENT DOCUMENTS

| | | | |
|---|---|---|---|
| 9,316,531 B2 | 4/2016 | Suga | |
| 9,595,809 B2 | 3/2017 | Uchida | |
| 10,403,784 B2 | 9/2019 | Suga | |
| 2006/0171437 A1* | 8/2006 | Takahashi | H01S 5/18311 |
| | | | 372/50.124 |
| 2014/0169397 A1 | 6/2014 | Kostamovaara et al. | |
| 2015/0311673 A1 | 10/2015 | Wang | |
| 2016/0341664 A1* | 11/2016 | Rothberg | H01S 5/0428 |
| 2017/0025817 A1* | 1/2017 | Onaka | H01S 3/094003 |
| 2019/0221988 A1* | 7/2019 | Villeneuve | G01S 7/4865 |
| 2020/0161833 A1* | 5/2020 | Weichmann | H01S 5/0428 |
| 2020/0166768 A1* | 5/2020 | Yoneda | B29C 64/386 |
| 2021/0103229 A1* | 4/2021 | Matsumoto | H01S 5/06804 |

FOREIGN PATENT DOCUMENTS

| | | | |
|---|---|---|---|
| JP | 2007-324313 A | 12/2007 | |
| JP | 2020-92256 A | 6/2020 | |
| JP | 2020-524910 A | 8/2020 | |
| JP | 2021-1756 A | 1/2021 | |

OTHER PUBLICATIONS

Japanese Office Action issued Apr. 2, 2025 during prosecution of related Japanese Application No. 2021-134111 (English-language machine translation included).

* cited by examiner

LIGHT SOURCE DEVICE AND DISTANCE MEASURING DEVICE

BACKGROUND OF THE INVENTION

Field of the Invention

The present invention relates to a light source device and a distance measuring device.

Description of the Related Art

VCSEL (Vertical Cavity Surface Emitting LASER) has attracted attention as a light source for LiDAR (Light Detection and Ranging) of ToF (Time of Flight) system. The VCSEL has an advantage in that the wavelength dependency with respect to temperature is small.

One requirement for a light source in order to perform high-precision distance measurement in the above system is that it can oscillate high intensity short pulse light. Japanese Patent Application Laid-Open No. 2020-524910 and U.S. Patent Application Publication No. 2014/0169397 disclose a VCSEL in which carriers are accumulated in an active layer and laser beam is emitted at once as a light source capable of emitting high intensity short pulse light.

However, in the VCSEL described in Japanese Patent Application Laid-Open No. 2020-524910 and U.S. Patent Application Publication No. 2014/0169397, the timing of the laser oscillation varies due to a change in the operating environment and the physical property value, and the distance measurement accuracy may decrease. Although it is possible to know the timing of the laser oscillation by using a part of the generated laser beam, there is a concern that the maximum range-measurable distance becomes short because the light amount of the laser beam irradiated to the range-measuring object decreases.

SUMMARY OF THE INVENTION

An object of the present invention is to provide a light source device capable of improving the detection accuracy of the oscillation timing of a laser beam without reducing the amount of light of the laser beam.

According to an embodiment of the present disclosure, there is provided a light source device including a light emitting element including a first reflector, a second reflector, and a resonator spacer portion provided between the first reflector and the second reflector and including an active layer, and emitting a first light as a laser beam and second light as a spontaneous emission light, a light receiving element configured to determine a light amount of the second light, and a determination unit configured to determine a timing at which the first light oscillates based on a decrease in an amount of the second light determined by the light receiving element.

Further features of the present invention will become apparent from the following description of exemplary embodiments with reference to the attached drawings.

BRIEF DESCRIPTION OF THE DRAWINGS

FIG. 1 is a schematic diagram illustrating a configuration example of a light source device according to a first embodiment of the present invention.

FIG. 7 is a schematic diagram illustrating a configuration example of a light source device according to a second embodiment of the present invention.

FIG. 18 is a schematic diagram illustrating a configuration example of a light source device according to a fifth embodiment of the present invention.

FIG. 19 is a graph illustrating temporal changes of a density of carriers accumulated in an active layer and a light intensity in a light emitting element according to a comparative example.

DESCRIPTION OF THE EMBODIMENTS

Figure 2:
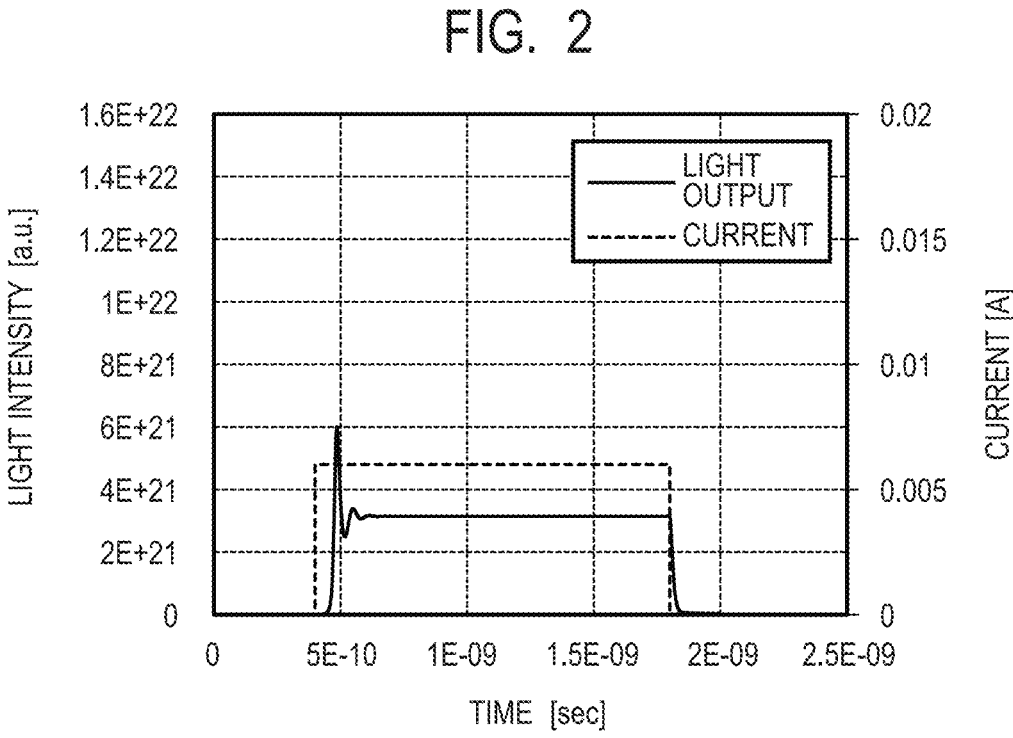
FIG. 2 is a graph illustrating a light output waveform of a light emitting element according to a comparative example.

Preferred embodiments of the present invention will now be described in detail in accordance with the accompanying drawings.

First Embodiment

Figure 1:
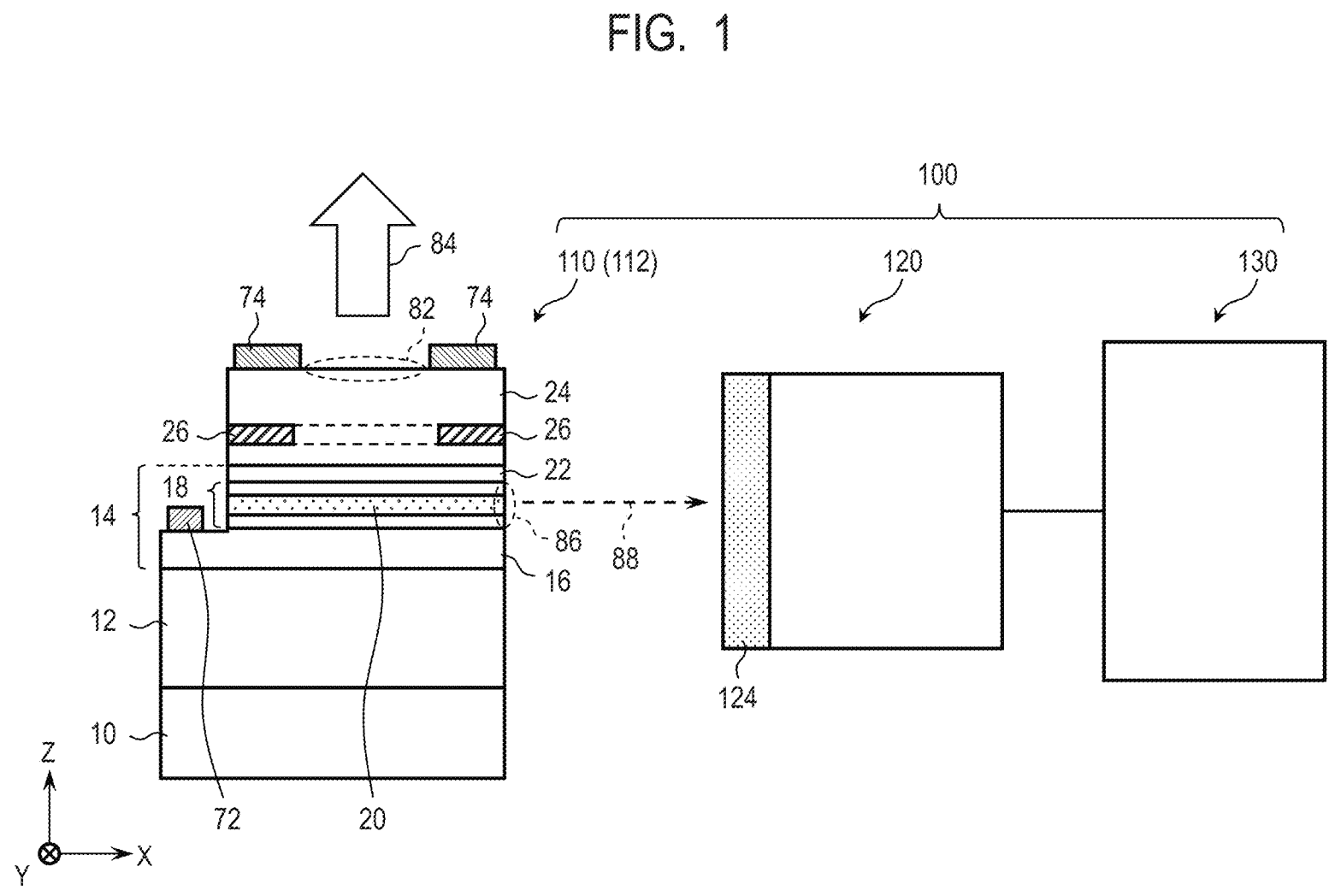

A light source device according to a first embodiment of the present invention will be described with reference to FIG. 1. FIG. 1 is a schematic diagram illustrating a configuration example of the light source device according to the present embodiment.

As illustrated in FIG. 1, the light source device 100 according to the present embodiment includes a light emitting unit 110, a light emission timing monitor 120, and a determination unit 130. Although FIG. 1 illustrates that the light emitting unit 110, the light emission timing monitor 120, and the determination unit 130 are separate components, any two or all of them may be configured as one component.

The light emitting unit 110 may include a semiconductor light emitting element, specifically a vertical cavity surface emitting laser (VCSEL) element having a distributed Bragg reflector (DBR). FIG. 1 is a schematic cross-sectional view of the light emitting element 112 constituting the light emitting unit 110.

The light emitting element 112 includes a semiconductor substrate 10, a lower DBR layer 12, a resonator portion 14, an upper DBR layer 24, and electrodes 72 and 74. The resonator portion 14 includes a semiconductor layer 16 of a first conductivity type (for example, n-type), a non-doped spacer portion 18, and a semiconductor layer 22 of a second conductivity type (for example, p-type). The lower DBR layer 12, the semiconductor layer 16, the non-doped spacer portion 18, the semiconductor layer 22, and the upper DBR layer 24 are stacked on one surface side (upper side in FIG. 1) of the semiconductor substrate 10 in this order. An active layer 20 is provided in the non-doped spacer portion 18. An oxidized constriction layer 26 is provided in the upper DBR layer 24. A layer (resonator portion 14) positioned between the lower DBR layer 12 and the upper DBR layer 24 is a resonator spacer unit.

The non-doped spacer portion 18, the semiconductor layer 22, and the upper DBR layer 24 are processed into a mesa shape. An electrode 72 forming an ohmic contact with the semiconductor layer 16 is provided on the semiconductor layer 16 exposed by processing the non-doped spacer portion 18, the semiconductor layer 22, and the upper DBR layer 24 into the mesa shape. An electrode 74 forming an ohmic contact with the upper DBR layer 24 is provided on the upper DBR layer 24. A protection film (not illustrated) may be provided on a sidewall of the mesa for the purpose of preventing the semiconductor surface from being altered in property.

The semiconductor substrate 10 may be, for example, a GaAs substrate. The lower DBR layer 12 may be formed, for example, by stacking 35 pairs of a stacked layer of an $Al_{0.1}GaAs$ layer and an $Al_{0.9}GaAs$ layer having an optical thickness of $\frac{1}{4}\lambda c$ as one pair. Here, $\lambda c$ is a center wavelength of a high reflection band of the lower DBR layer 12, and is 940 nm in the present embodiment.

The resonator portion 14 is composed of a p-i-n junction existing also in a general VCSEL, and has a configuration similar to that of a resonator portion including an active layer in an i-layer. That is, the resonator portion 14 is formed of a p-i-n junction including the semiconductor layer 16 of the first conductivity type, the non-doped spacer portion 18, and the semiconductor layer 22 of the second conductivity type. The optical thickness of the resonator portion 14 may be, for example, 2 $\lambda c$.

The active layer 20 disposed in the non-doped spacer portion 18 may be composed of, for example, a multiple quantum well including four quantum wells each including an InGaAs well layer having a thickness of 8 nm sandwiched between AlGaAs barrier layers having a thickness of 10 nm. The AlGaAs barrier layer is designed to have a smaller band gap than a barrier layer used in a quantum well layer of a general VCSEL, and thereby to accumulate carriers in the barrier layer. The semiconductor layer 16 may be formed of an n-type GaAs layer, the semiconductor layer 22 may be formed of a p-type GaAs layer, and the other portions of the non-doped spacer portion 18 may be formed of a non-doped GaAs layer.

The active layer 20 is preferably disposed at a position shifted from the antinode position of the standing wave instead of the antinode position of the standing wave used in the design of a general VCSEL. For example, the active layer 20 may be disposed at a position where the standing wave factor is 0.2 ($\xi$=0.2). With this configuration, carriers may be accumulated in the active layer 20 and emitted at once, and laser beam of short pulse light may be emitted.

The upper DBR layer 24 may be formed, for example, by stacking 20 pairs of a stacked layer of a p-type $Al_{0.1}Ga_{0.9}As$ layer and an $Al_{0.9}Ga_{0.1}As$ layer having an optical thickness of $\frac{1}{4}\lambda c$ as one pair. In the upper DBR layer 24, an oxidized constriction layer 26 formed by oxidizing a part of an $Al_{0.98}Ga_{0.02}As$ layer having a thickness of 30 nm is provided. The oxidized constriction layer 26 may be formed, for example, by oxidizing an $Al_{0.98}Ga_{0.02}As$ layer from the side surface of the mesa with water vapor during manufacturing. The oxidized constriction layer 26 has a non-oxidized portion in the center portion of the mesa and an oxidized portion in the vicinity of the sidewall of the mesa. Thus, since the current injected into the light emitting element 112 flows only in the non-oxidized portion, laser oscillation occurs only in the portion of the light emitting element 112 overlapping with the center portion of the mesa in a plan view.

By driving the light emitting element 112, a laser beam 84 is mainly emitted from a first portion 82 of an upper surface of the upper DBR layer 24 where the electrode 74 is not provided, and a spontaneous emission light (a light produced by spontaneous emission) 88 is mainly emitted from a second portion 86 which is an end portion of the active layer 20. The laser beam 84 may include a component in a direction (Z direction in FIG. 1) parallel to a normal to the semiconductor substrate 10. The spontaneous emission light 88 may include a component in a direction parallel to the surface of the semiconductor substrate 10 (X direction or Y direction in FIG. 1). In other words, the light emitting element 112 emits the laser beam 84 in a first direction and the spontaneous emission light 88 in a second direction intersecting the first direction.

The light emission timing monitor 120 includes a light receiving unit 124 that generates an electric signal in response to incidence of light. The light emission timing monitor 120 is disposed adjacent to the light emitting unit 110 so that the spontaneous emission light 88 emitted from the second portion 86 of the light emitting element 112 is incident on the light receiving unit 124.

The determination unit 130 is connected to the light emission timing monitor 120, and has a function of detecting the timing of the start of laser oscillation in the light emitting element 112 in accordance with the incidence of the spontaneous emission light 88 on the light receiving unit 124 of the light emission timing monitor 120.

The light emitting element 112 of the present embodiment is a VCSEL which has a mechanism of accumulating carriers into the active layer beyond a threshold carrier density (a carrier density for generating a gain necessary for laser oscillation) and performs an operation of accumulating carriers into the active layer 20 and releasing the carriers at once. In such a VCSEL, when the rise of the spontaneous emission light is detected in the same manner as in the detection of the light emission timing in a general VCSEL, it has been revealed for the first time by the inventors of the present application that the following problems occur.

Figure 3:
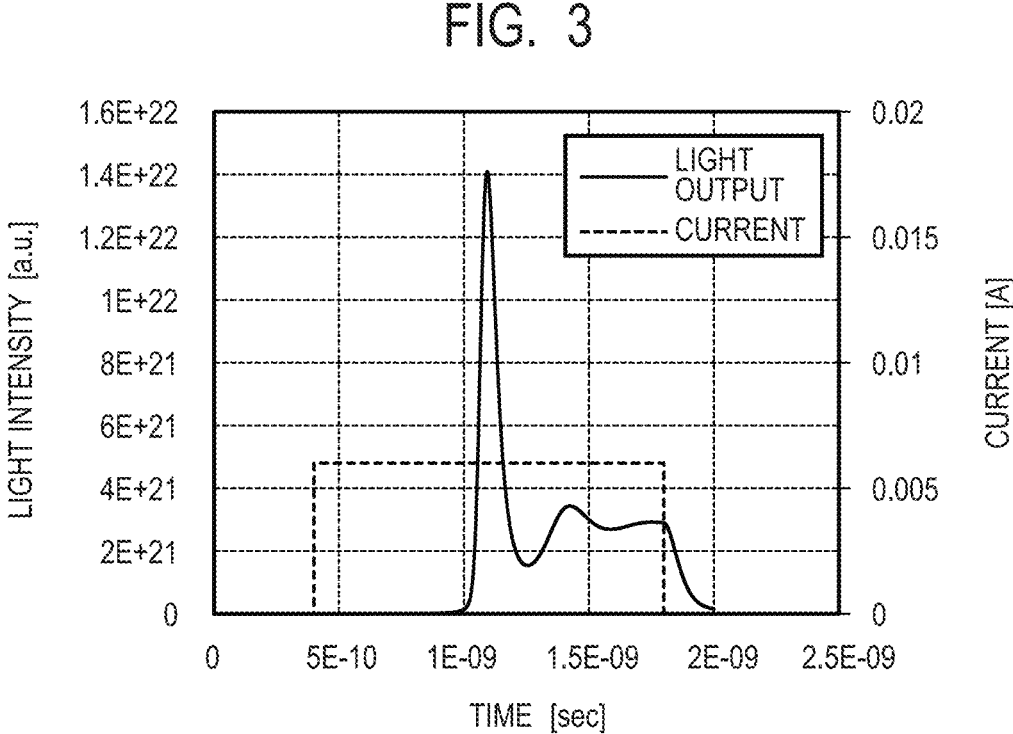
FIG. 3 is a graph illustrating a light output waveform of a light emitting element according to the first embodiment of the present invention.

FIG. 2 and FIG. 3 are graphs illustrating the results obtained by calculation of the light output waveform of the light emitting element. FIG. 2 is a light output waveform of the light emitting element according to the comparative example, and FIG. 3 is a light output waveform of the light emitting element 112 of the present embodiment.

In the case of a general VCSEL in which an active layer is disposed at the position of the antinode of a standing wave, as illustrated in, e.g., FIG. 2, oscillation starts at about 70 psec from the start of current injection, and the light output rises. Then, the light output reaches the peak of the light waveform accompanying the relaxation vibration, and then converges to a steady value.

On the other hand, the light emitting element 112 of the present embodiment emits light having a maximum peak value and a profile that converges to a stable value that is a predetermined light intensity after the maximum peak value. That is, in the light emitting element 112 of the present embodiment, as illustrated in, e.g., FIG. 3, oscillation starts after a lapse of about 600 psec from the start of current injection.

Figure 4:
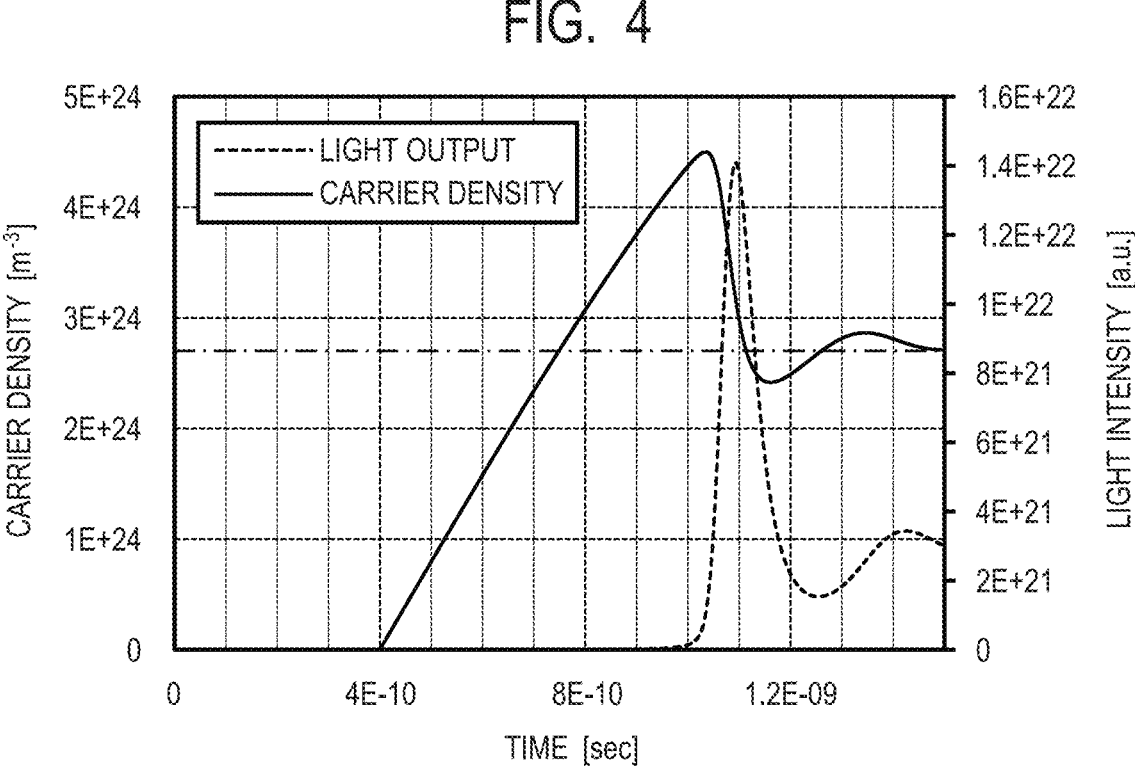
FIG. 4 is a graph illustrating temporal changes of a density of carriers accumulated in an active layer and a light intensity in the light emitting element according to the first embodiment of the present invention.

FIG. 4 is a graph illustrating the results obtained by calculating temporal changes of a carrier density accumulated in the active layer 20 and a light intensity. A current injected into the light emitting element 112 has a waveform similar to that of FIG. 3, and the injection is started from a time point of 4E-10 seconds on the time axis. The threshold carrier density (carrier density converged after the start of oscillation) of the light emitting element 112 is 2.7E+24 m$^{-3}$ (represented by a one-dot-chain line in FIG. 4). The light intensity in FIG. 4 is the light intensity of the laser beam 84, and the carrier density in FIG. 4 correlates with the light intensity of the spontaneous emission light 88. That is, the higher the carrier density, the higher the light intensity of the spontaneous emission light 88.

As illustrated in FIG. 4, the carrier density of the active layer 20 begins to increase with the start of current injection. Although the threshold carrier density in the light emitting element 112 of the present embodiment is 2.7E+24 m$^{-3}$, carriers continue to accumulate temporarily beyond the threshold carrier density in a state before laser oscillation starts. Thereafter, when laser oscillation starts, carriers are rapidly consumed by stimulated emission and the carrier density converges to a stable value.

Thus, in the light emitting element 112 of the present embodiment, more carriers are accumulated in the active layer 20 beyond the threshold carrier density. Then, carriers accumulated in the active layer 20 after the start of laser oscillation are converted into photons by stimulated emission. This makes it possible to output a light pulse having a high peak value and a narrow width at half maximum as illustrated in FIG. 3. This light pulse is shorter than the current pulse for driving the VCSEL.

Here, when attention is paid to the temporal changes of the increase/decrease of the light intensity of the spontaneous emission light and the increase/decrease of the intensity of the laser beam, as illustrated in FIG. 4, it is understood that the light intensity (carrier density) of the spontaneous emission light has passed the peak value, and the light intensity (light output) of the laser beam has reached the peak value while the light intensity is rapidly lowered. Specifically, a shift of about 100 psec occurs between the peak time of the light intensity of the spontaneous emission light and the peak time of the light intensity of the laser beam. Therefore, in the short pulse VCSEL such as the light emitting element 112 of the present embodiment, it is difficult to detect the rising edge of the spontaneous emission light 88 and directly apply the detection time as the oscillation timing of the laser beam 84.

As described above, since the laser beam 84 emitted from the light emitting element 112 and the spontaneous emission light 88 have different timings at which intensity peaks appear, it is preferable that the light receiving unit 124 of the light emission timing monitor 120 do not receive the laser beam 84. To this end, for example, a method of disposing a light shielding film on a side (the upper side in FIG. 1) of the light emission timing monitor 120 from which the laser beam 84 is emitted may be applied. Alternatively, a method of disposing a wavelength filter that transmits the spontaneous emission light 88 but does not transmit the laser beam 84, that is, a wavelength filter having a function of a band-stop filter or a long-pass filter with respect to the wavelength region of the laser beam 84, between the light emitting element 112 and the light emission timing monitor 120 may be applied.

The spontaneous emission light 88 incident on the light emission timing monitor 120 is converted into an electric signal by photoelectric conversion in the light receiving unit 124, and is output to the determination unit 130 as an output of the light receiving unit along with time information.

The determination unit 130 detects a temporal change of an amount of light of the spontaneous emission light 88 from an output of the light-receiving unit and time information received from the light emission timing monitor 120, and determines whether or not the laser beam 84 is output from the light emitting element 112. That is, the determination unit 130 detects the timing of laser oscillation in the light emitting element 112.

Here, a sampling interval of the intensity of the spontaneous emission light 88 may be appropriately set according to the characteristics required for a device on which the light source device 100 is mounted. For example, when the light source device 100 of the present embodiment is applied to a distance measuring device, the distance may be appropriately set according to the distance measuring accuracy required for the distance measuring device. For example, when the distance measurement accuracy of the distance resolution of 1 cm is required, the time required for the light to reciprocate at a distance of 1 cm is about 67 psec, and the sampling interval of the spontaneous emission light 88 is preferably about 1/10 or less thereof. Note that sampling of the spontaneous emission light 88 may be performed at regular intervals according to a desired distance measurement accuracy by using a timing generator or the like.

Next, a method of detecting the oscillation timing of the laser beam 84 will be described with reference to FIG. 5 and FIG. 6. Although some methods of detecting the oscillation timing of the laser beam 84 are described here, the method of detecting the oscillation timing of the laser beam 84 is not limited thereto.

As a first method of detecting the oscillation timing of the laser beam 84, there is a method of using a differential value of the carrier density. FIG. 5 is a graph obtained by time-differentiating the carrier density values illustrated in FIG. 4 and enlarging a part of the time axis. The value of the vertical axis in FIG. 5 actually corresponds to the differential value of the light output value in the light emission timing monitor 120.

In the first method, a predetermined threshold value is set for the differential value of the carrier density, and the time when the differential value of the carrier density becomes equal to or less than the threshold value is set as the oscillation timing of the laser beam 84. For example, in FIG. 5, when the threshold value of the carrier density differential value is set to −1 (represented by a one-dot-chain line in FIG. 5), the oscillation timing of the laser beam 84 is 1.05E-9 sec. When the deviation between the actual oscillation timing of the laser beam and the timing calculated as described above is large with respect to the distance measurement accuracy, the threshold value may be adjusted to a more appropriate value.

Figure 5:
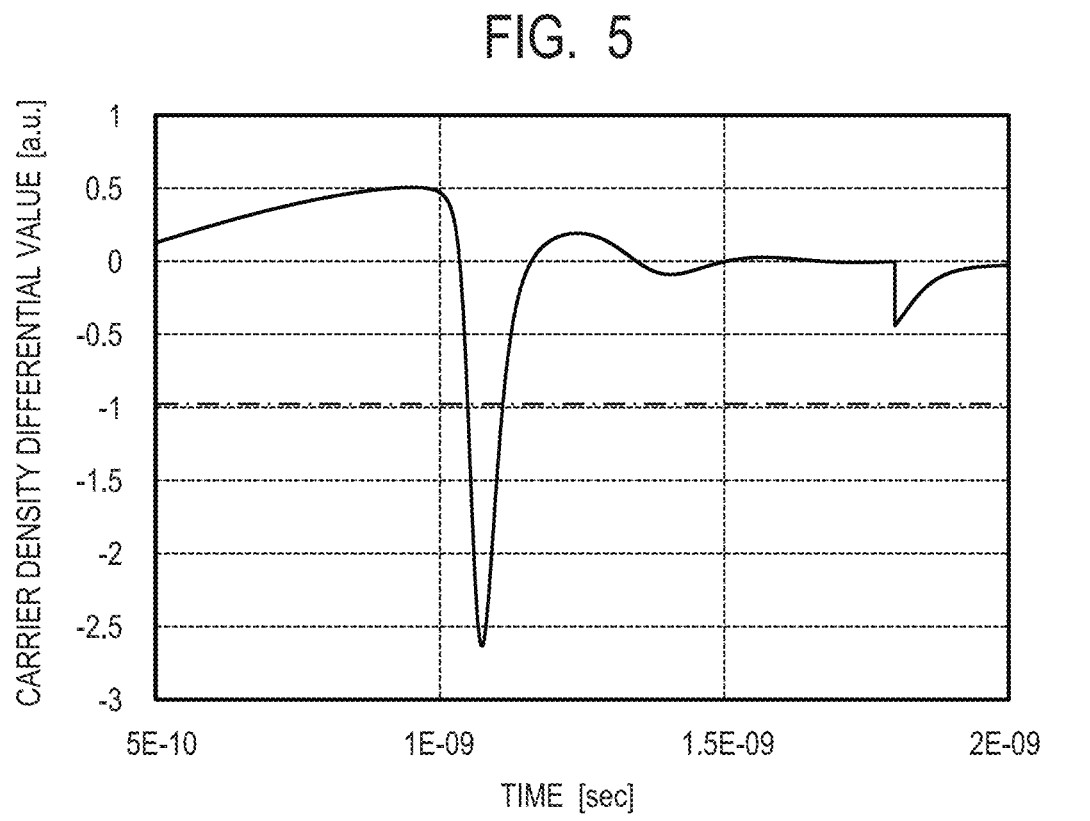
FIG. 5 is a graph illustrating a temporal change of a carrier density differential value.

Instead of setting a predetermined threshold value for the differential value of the carrier density in the graph of FIG. 5, an intermediate time between a time at which the differential value of the carrier density becomes the maximum value and a time at which the differential value of the carrier density becomes the minimum value may be estimated as a peak time of the laser beam 84.

As a second method of detecting the oscillation timing of the laser beam 84, there is a method of using a second-order differential value of the carrier density. FIG. 6 is a graph obtained by further time-differentiating the carrier density differential value illustrated in FIG. 5, i.e., by second order differentiating the carrier density value illustrated in FIG. 4. FIG. 6 also illustrates the temporal change of the laser beam intensity illustrated in FIG. 4.

Figure 6:
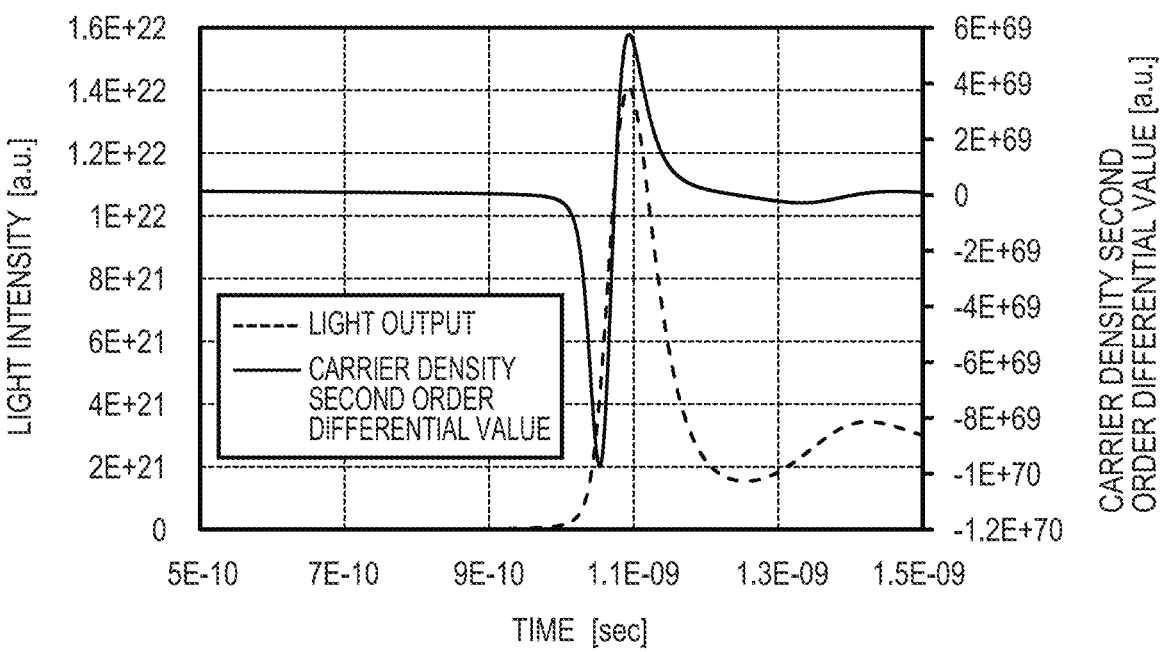
FIG. 6 is a graph illustrating temporal changes of a light intensity and a carrier density second order differential value.

As illustrated in FIG. 6, the time at which the second order differential value of the carrier density shows the peak value substantially coincides with the time at which the laser beam intensity shows the peak value. Therefore, by detecting the time at which the second order differential value of the light intensity of the spontaneous emission light 88 indicates the peak value, the time at which the intensity of the laser beam 84 becomes almost the peak value may be detected.

As a method of detecting the oscillation timing of the laser beam 84, there are a method of detecting based on the decrease in the amount of the spontaneous emission light 88 as described above, and a method of using a lookup table. In this case, the delay time of the peak time of the laser beam 84 with respect to the peak time of the spontaneous emission light 88 is measured in advance including environmental information such as temperature dependence, and a lookup table representing the relationship is prepared. By referring to the lookup table based on the environmental information during operation, the peak time of the laser beam 84 corresponding to the environmental information may be appropriately predicted.

The distance to an object may be accurately measured from the difference between the time of the oscillation timing of the laser beam calculated in this manner and the time at which the light emission timing monitor 120 detects the return light of the laser beam irradiated to the object.

Examples of a method of determining the peak time of the spontaneous emission light 88 include a method of selecting a time at which the output of the light receiving unit becomes the maximum in a certain period after the driver current is applied, and a method of selecting a time at which the differential value of the intensity of the spontaneous emission light 88 becomes from positive to negative.

Although the main purpose of the present embodiment is to detect the oscillation timing of the laser beam, it is also possible to detect a failure of the light source device 100 by using the above configuration. For example, when it is detected that the amount of light of the spontaneous emission light 88 does not decrease (the amount of light does not change), it is determined that the laser beam is not oscillated without monitoring the laser beam 84, and therefore, the output of the light emission timing monitor 120 may be used for failure detection of the light source device 100.

As described above, according to the present embodiment, since the oscillation timing of the laser beam is detected using the spontaneous emission light, the accuracy of measuring the oscillation timing of the laser beam may be improved without lowering the light amount of the laser beam. By mounting the light source device of the present embodiment in the LiDAR (Light Imaging Detection and Ranging) system, a LiDAR system with good distance measurement accuracy may be realized.

Second Embodiment

Figure 7:
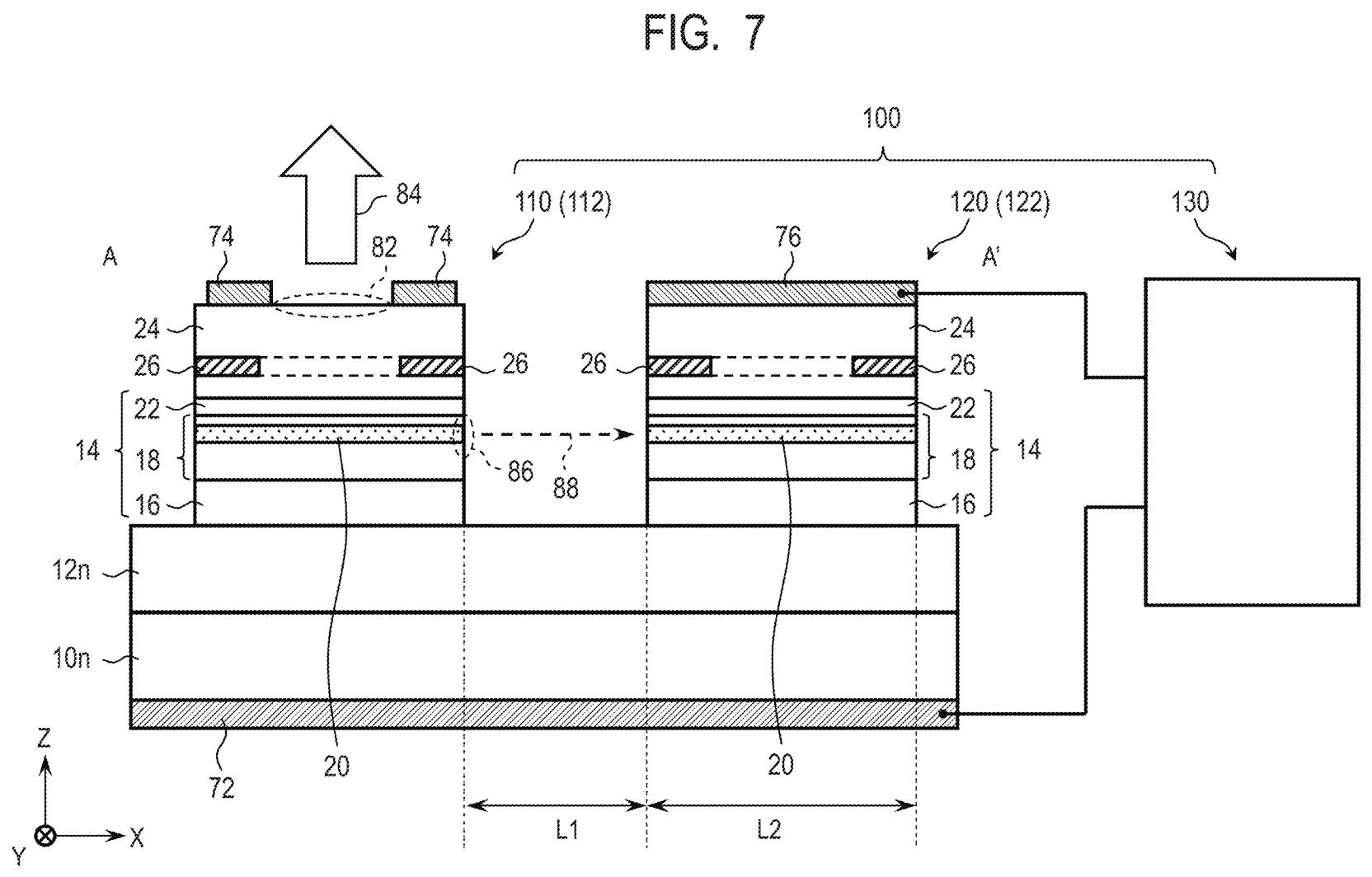

A light source device according to a second embodiment of the present invention will be described with reference to FIG. 7. The same components as those of the light source device according to the first embodiment are denoted by the same reference numerals, and description thereof will be omitted or simplified. FIG. 7 is a schematic diagram illustrating a configuration example of the light source device according to the present embodiment.

The light source device according to the present embodiment has the same basic configuration as the light source device according to the first embodiment. The light source device 100 according to the present embodiment is different from the light source device according to the first embodiment in that, as illustrated in FIG. 7, the light emitting element 112 and the light receiving element 122 constituting the light emission timing monitor 120 are provided on the same semiconductor substrate.

The light emitting element 112 includes a semiconductor substrate 10*n* of a first conductivity type (for example, n-type), a lower DBR layer 12*n* of the first conductivity type (for example, n-type), a resonator portion 14, an upper DBR layer 24 of a second conductivity type (for example, p-type), and electrodes 72 and 74. The resonator portion 14 includes a semiconductor layer 16 of the first conductivity type (for example, n-type), a non-doped spacer portion 18, and a semiconductor layer 22 of the second conductivity type (for example, p-type). The lower DBR layer 12*n*, the semiconductor layer 16, the non-doped spacer portion 18, the semiconductor layer 22, and the upper DBR layer 24 are stacked in this order on one surface side of the semiconductor substrate 10*n*. An active layer 20 is provided in the non-doped spacer portion 18. An oxidized constriction layer 26 is provided in the upper DBR layer 24.

The light receiving element 122 may be a semiconductor light receiving element configured by a semiconductor stacked structure similar to that of the light emitting element 112. That is, the light receiving element 122 includes a semiconductor substrate 10*n* of the first conductivity type (for example, n-type), a lower DBR layer 12*n* of the first conductivity type (for example, n-type), a resonator portion 14, an upper DBR layer 24, and electrodes 72 and 76. The resonator portion 14 includes a semiconductor layer 16 of the first conductivity type (for example, n-type), a non-doped spacer portion 18, and a semiconductor layer 22 of the second conductivity type (for example, p-type). The lower DBR layer 12n, the semiconductor layer 16, the non-doped spacer portion 18, the semiconductor layer 22, and the upper DBR layer 24 are stacked in this order on one surface side of the semiconductor substrate 10n. An active layer 20 is provided in the non-doped spacer portion 18. An oxidized constriction layer 26 is provided in the upper DBR layer 24. The active layer 20 of the light receiving element 122 corresponds to the light receiving unit 124 of the light emission timing monitor 120.

The semiconductor layer 16, the non-doped spacer portion 18, the semiconductor layer 22, and the upper DBR layer 24 are processed into a mesa shape, and are separated between the light emitting element 112 and the light receiving element 122. In the example of FIG. 7, the upper DBR layer 24 to the semiconductor layer 16 are processed into the mesa shape, but the depth at which the light emitting element 112 and the light receiving element 122 are separated from each other is not necessarily limited to this example. That is, it is sufficient that the light emitting element 112 is configured so as to perform laser oscillation at the center portion thereof, and it is sufficient that the light emitting element 112 and the light receiving element 122 are separated from each other at least in a region up to the side of the semiconductor substrate 10n of the oxidized constriction layer 26.

An electrode 72 forming an ohmic contact with the semiconductor substrate 10n is provided on the side of the semiconductor substrate 10n opposite to the surface on which the lower DBR layer 12n is provided. An electrode 74 forming an ohmic contact with the upper DBR layer 24 is provided on the upper DBR layer 24 of the light emitting element 112. An electrode 76 forming an ohmic contact with the upper DBR layer 24 is provided on the upper DBR layer 24 of the light receiving element 122. A protection film (not illustrated) may be provided on a sidewall of the mesas for the purpose of preventing the semiconductor surface from being altered in property.

The electrode 72 is common to the light emitting element 112 and the light receiving element 122. The electrode 76 may have a function as a light shielding film for preventing the laser beam 84 from entering the light receiving unit 124 (the active layer 20 of the light receiving element 122). Although the laser beam 84 is emitted in the vertical direction (the upper side in FIG. 7) with respect to the semiconductor substrate 10n, reflected light, stray light, or the like may be incident on the light receiving unit 124 due to influence of an optical system, a mounting component (not illustrated), or the like located at the front of the light emitting element 112. In order to prevent such reflection light or stray light from entering, the electrode 76 is preferably disposed so as to cover the entire upper portion of the light receiving unit 124.

The semiconductor substrate 10n may be, for example, an n-type GaAs substrate. The lower DBR layer 12n may be formed, for example, by stacking 35 pairs of a stacked layer of an n-type $Al_{0.1}GaAs$ layer and an $Al_{0.9}GaAs$ layer having an optical thickness of $\frac{1}{4}$ $\lambda c$ as one pair. Here, $\lambda c$ is the center wavelength of a high reflection band of the lower DBR layer 12, and is 940 nm in the present embodiment. The upper DBR layer 24 may be formed, for example, by stacking 20 pairs of a stacked layer of a p-type $Al_{0.1}Ga_{0.9}As$ layer and an $Al_{0.9}Ga_{0.1}As$ layer having an optical thickness of $\frac{1}{4}$ $\lambda c$ as one pair. The resonator portion 14 may have a configuration similar to that of the light emitting element 112 of the first embodiment.

The light emitting element 112 is driven by a forward bias voltage applied between the electrodes 72 and 74. Since the current injected into the light emitting element 112 flows only in the non-oxidized portion of the central portion of the mesa where the oxidized constriction layer 26 is not provided, laser oscillation occurs only in the portion of the light emitting element 112 overlapping the central portion of the mesa in a plan view. The light receiving element 122 is driven by a reverse bias voltage applied between the electrode 72 and the electrode 76, and detects an amount of the spontaneous emission light 88 incident on the active layer 20 (light receiving unit 124). The determination unit 130 detects an oscillation timing of the laser beam 84 based on light amount information for each time received from the light receiving element 122 (the light emission timing monitor 120).

Next, a positional relationship between the light emitting element 112 and the light receiving element 122 will be described with reference to FIG. 7 to FIG. 9.

Figure 8:
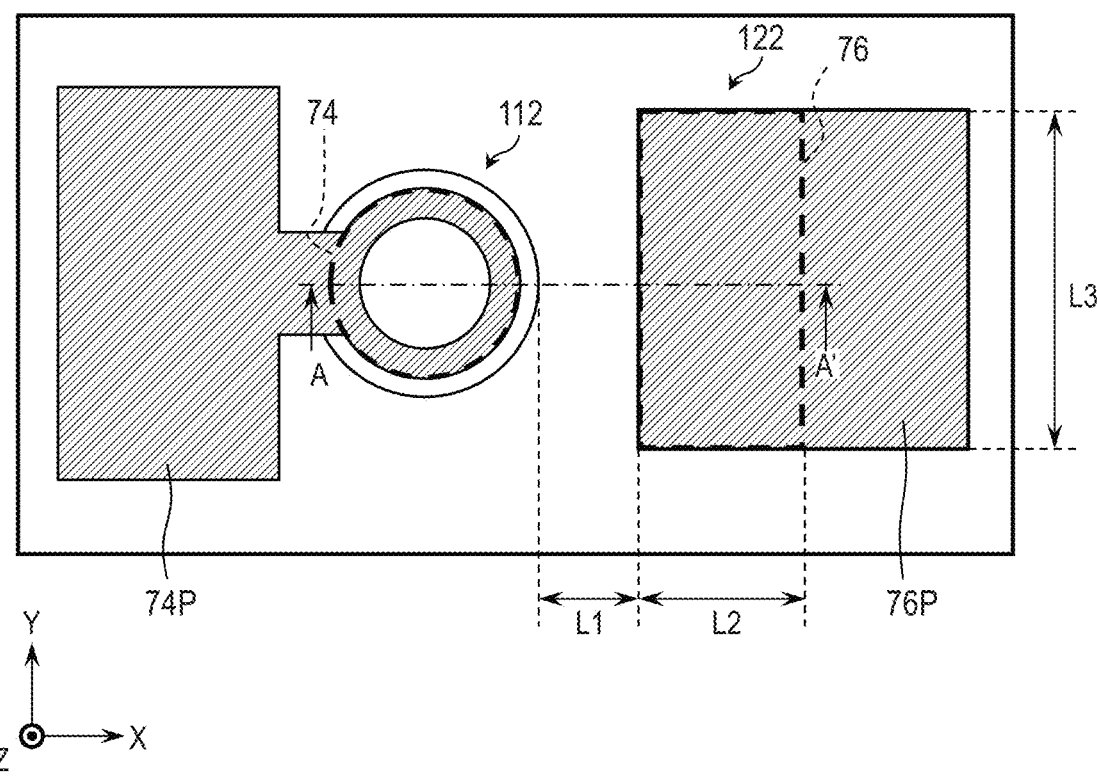
FIG. 8 is a top view illustrating a positional relationship between a light emitting element and a light receiving element of the light source device according to the second embodiment of the present invention.

FIG. 8 is a top view illustrating a positional relationship between the light emitting element and the light receiving element in the light source device of the present embodiment. The cross sections of the light emitting element and the light receiving element in FIG. 7 correspond to the cross section taken along the line A-A' in FIG. 8. In the coordinate system illustrated in FIG. 7 and FIG. 8, the X-Y plane is a plane parallel to the surface of the semiconductor substrate 10n, and the Z direction is a direction parallel to the normal direction of the semiconductor substrate 10n.

A pad electrode 74P is connected to the electrode 74. The pad electrode 74P is an electrode to which a wiring for supplying a voltage to the electrode 74 is connected. For example, as illustrated in FIG. 8, the electrode 74 and the pad electrode 74P may be composed of one continuous electrode pattern. A portion indicated by a broken line in FIG. 8 corresponds to the outer peripheral portion of the electrode 74 in FIG. 7.

Similarly, a pad electrode 76P is connected to the electrode 76. The pad electrode 76P is an electrode to which a wiring for supplying a voltage to the electrode 76 is connected. The electrode 76 and the pad electrode 76P may be composed of one continuous electrode pattern, for example, as illustrated in FIG. 8. A portion indicated by a broken line in FIG. 8 corresponds to the electrode 76 in FIG. 7.

Here, it is assumed that the light emitting element 112 and the light receiving element 122 are arranged side by side in the X direction in the coordinate system illustrated in FIG. 8. A distance from an end face of the light emitting element 112 to an end face of the active layer 20 of the light receiving element 122 is L1. In the coordinate system illustrated in FIG. 8, a length of one side of the electrode 76 along the X direction is L2, and a length of the electrode 76 along the Y direction is L3.

Figure 9:
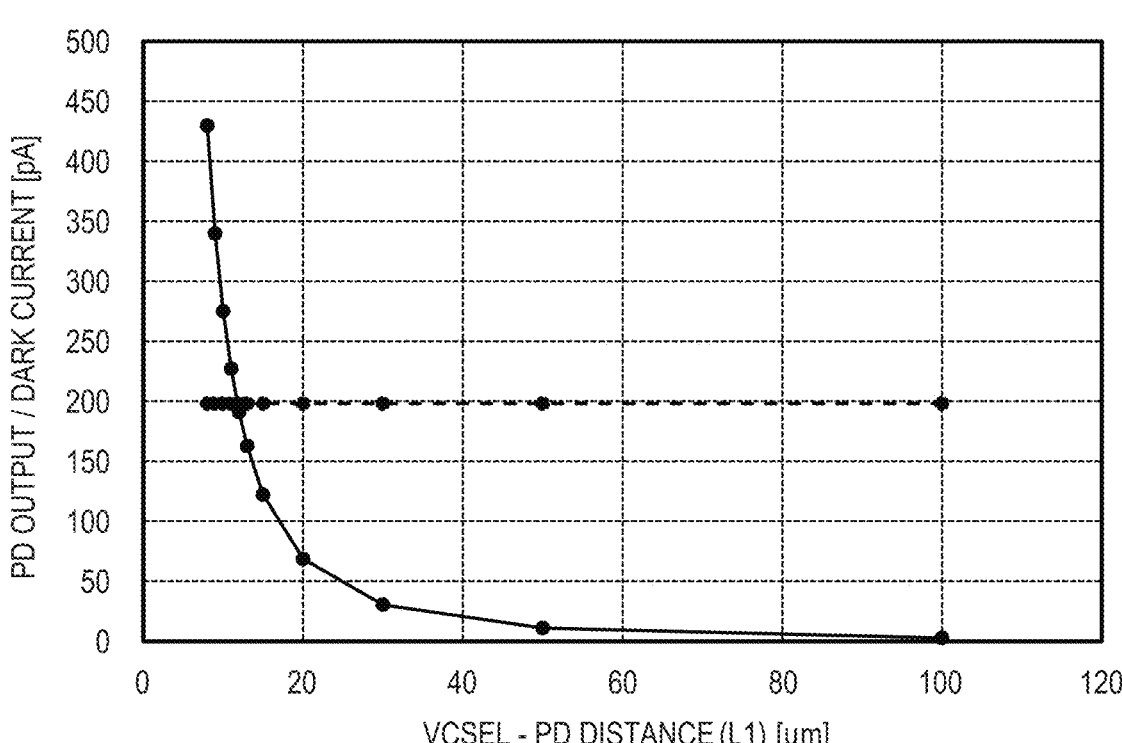
FIG. 9 is a graph illustrating a relationship between an output and a dark current of the light receiving element and a distance between the light emitting element and the light receiving element.

FIG. 9 is a graph illustrating dependences of an output of the light receiving element 122 and a dark current flowing between the electrodes 72 and 76 on the distance L1. In FIG. 9, a solid line indicates the output of the light receiving element 122, and a broken line indicates the dark current flowing between the electrodes 72 and 76 of the light receiving element 122. Here, it is assumed that both the length L2 and the length L3 are 100 μm.

As illustrated in FIG. 9, the dark current flowing between the electrodes 72 and 76 of the light receiving element 122 is constant regardless of the distance L1 from the end face of the light emitting element 112 to the end face of the active layer 20 of the light receiving element 122. That is, if the configuration of the light receiving element 122 is determined, the dark current flowing between the electrodes 72 and 76 becomes constant regardless of the distance L1.

On the other hand, the output of the light receiving element 122 tends to increase as the distance L1 decreases, and the output of the light receiving element 122 is sharply increased when the distance L1 falls below about 30 When the distance L1 is shorter than 11 the output of the light receiving element 122 exceeds the dark current. In other words, by making the distance L1 shorter than 11 the spontaneous emission light 88 emitted from the light emitting element 112 can be detected by the light receiving element 122. In order to accurately detect the increase or decrease of the light amount of the spontaneous emission light 88, the distance L1 is preferably set to 8 $\mu$m or less. By setting the distance L1 to 8 $\mu$m or less, the S/N ratio becomes 2 or more.

The relationship between the output of the light receiving element 122 and the distance L1 and the value of the dark current vary depending on the area (length L2, L3) of the light receiving element 122. When the area of the light receiving element 122 is increased, the dark current also increases, but the detected light amount, that is, the detected current value also increases. In this case, although the S/N ratio does not change, the detection current value is large, so that the detection current value becomes stronger to noise in the signal processing in the determination unit 130, whereby the circuit design becomes easier, and the necessary accuracy of the circuit design is alleviated. From such a viewpoint, it is preferable to increase the area of the light receiving element 122 and increase the detection current value.

In the case where the light emitting element 112 and the light receiving element 122 are formed on the same semiconductor substrate as in the present embodiment, the distance L1 between the light emitting element 112 and the light receiving element 122 can be accurately controlled with accuracy corresponding to the process manufacturing accuracy of the photolithography process.

Although a case where the light emitting unit 110 has one light emitting element 112 is exemplified in the present embodiment, the number of light emitting elements 112 included in the light emitting unit 110 is not limited to one, and the light emitting unit 110 may include a plurality of light emitting elements 112.

Figure 10:
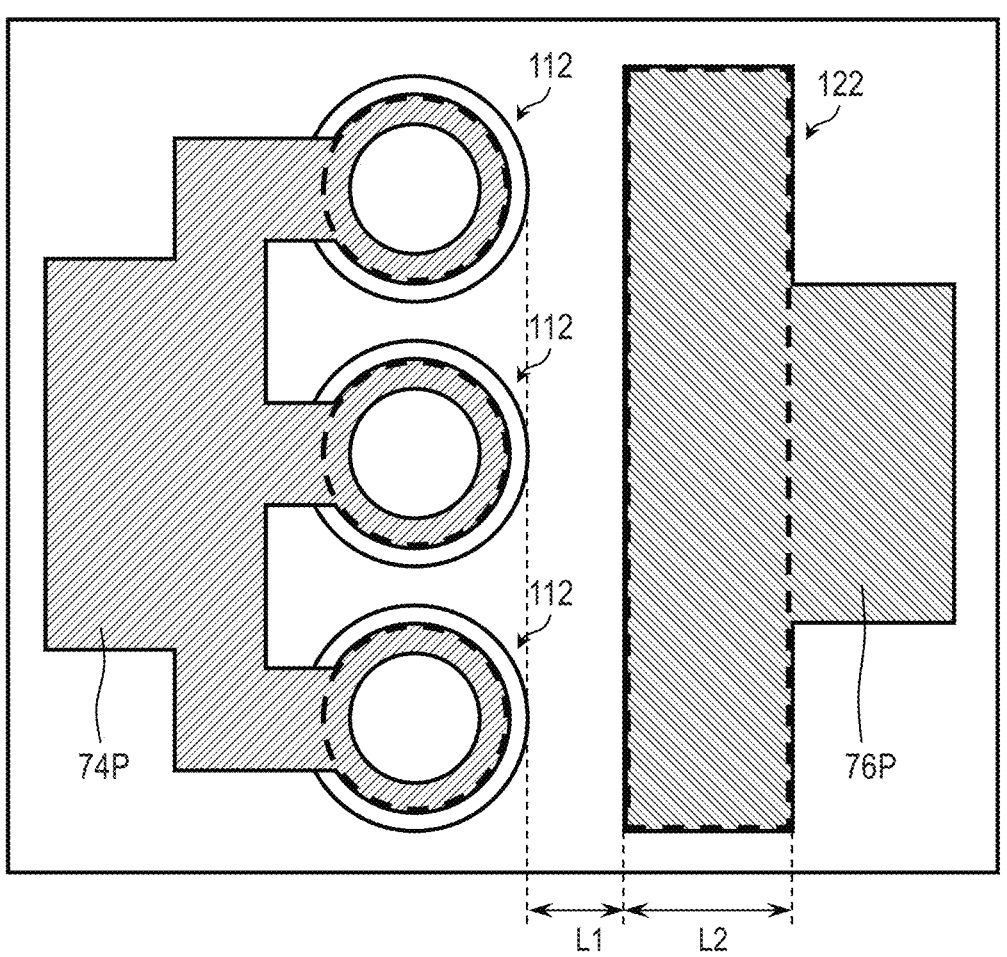
FIG. 10 and FIG. 11 are top views illustrating configuration examples of a light source device according to a modified example of the second embodiment of the present invention.

FIG. 10 illustrates a case where the light emitting unit 110 includes three light emitting elements 112 arranged in a straight line in a plan view. In the case where a plurality of light emitting elements 112 are arranged side by side in a straight line, it is preferable that the light receiving element 122 be arranged such that an end portion of the light receiving element 122, which is a light receiving surface, is parallel to a direction in which the light emitting elements 112 are arranged, as illustrated in FIG. 10. By arranging the light emission timing monitor 120 in this manner for a plurality of light emitting elements 112 driven at the same time, although the S/N ratio does not change, the detected current value can be increased. The number of light emitting elements 112 included in the light emitting unit 110 is not limited to three.

Figure 11:
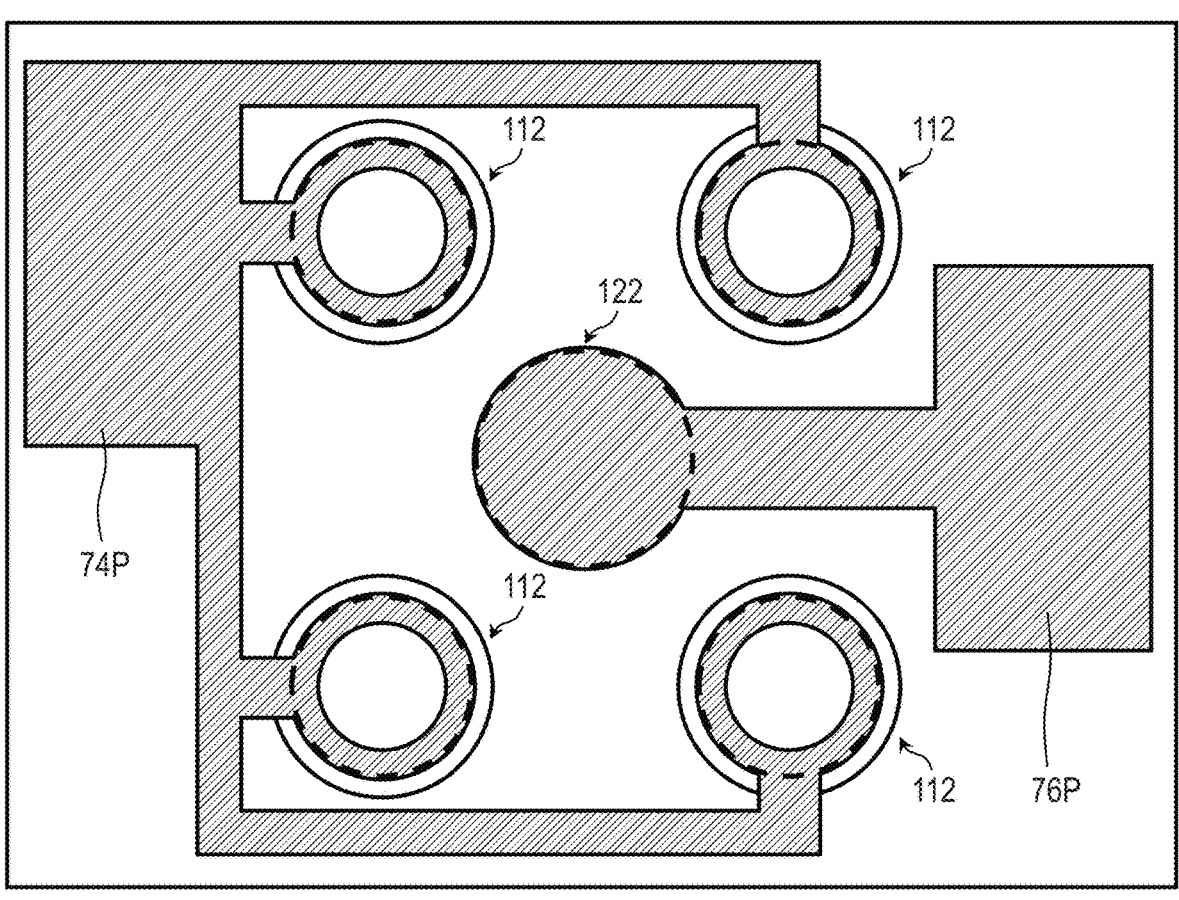

FIG. 11 illustrates a case where the light emitting unit 110 includes four light emitting elements 112 arranged so as to surround the light receiving element 122 in a plan view. By arranging the light emission timing monitor 120 in this manner for a plurality of light emitting elements 112 driven at the same time, the amount of light incident on the light emission timing monitor 120, i.e., the amount of signal, increases, so that the S/N ratio can be increased. Here, as illustrated in FIG. 11, the extraction electrode (portion connected to the electrode 74) of the light emitting element 112 from the mesa is preferably disposed so as to avoid the light receiving element 122 side as much as possible. By doing so, it is possible to lower the ratio of blocking the spontaneous emission light component from the light emitting element 112, and it is possible to increase the amount of light detected by the light emission timing monitor 120. The number of light emitting elements 112 included in the light emitting unit 110 is not limited to four.

In the present embodiment, the light emitting element 112 and the light receiving element 122 are formed with the same semiconductor stacked structure, but the light emitting element 112 and the light receiving element 122 do not necessarily have to have the same semiconductor stacked structure. For example, the semiconductor stacked structure of the light receiving element 122 may be formed over the semiconductor stacked structure of the light emitting element 112. In this case, the semiconductor layer added for the light receiving element 122 is removed from the portion of the light emitting element 112. With such a structure, the element design of the light receiving element 122 may be performed without being limited to the element design of the light emitting element 112.

As described above, according to the present embodiment, since the oscillation timing of the laser beam is detected using the spontaneous emission light, the accuracy of measuring the oscillation timing of the laser beam may be improved without lowering the light amount of the laser beam. Further, by mounting the light source device of the present embodiment in a LiDAR system, a LiDAR system with good distance measurement accuracy may be realized.

Third Embodiment

Figure 12:
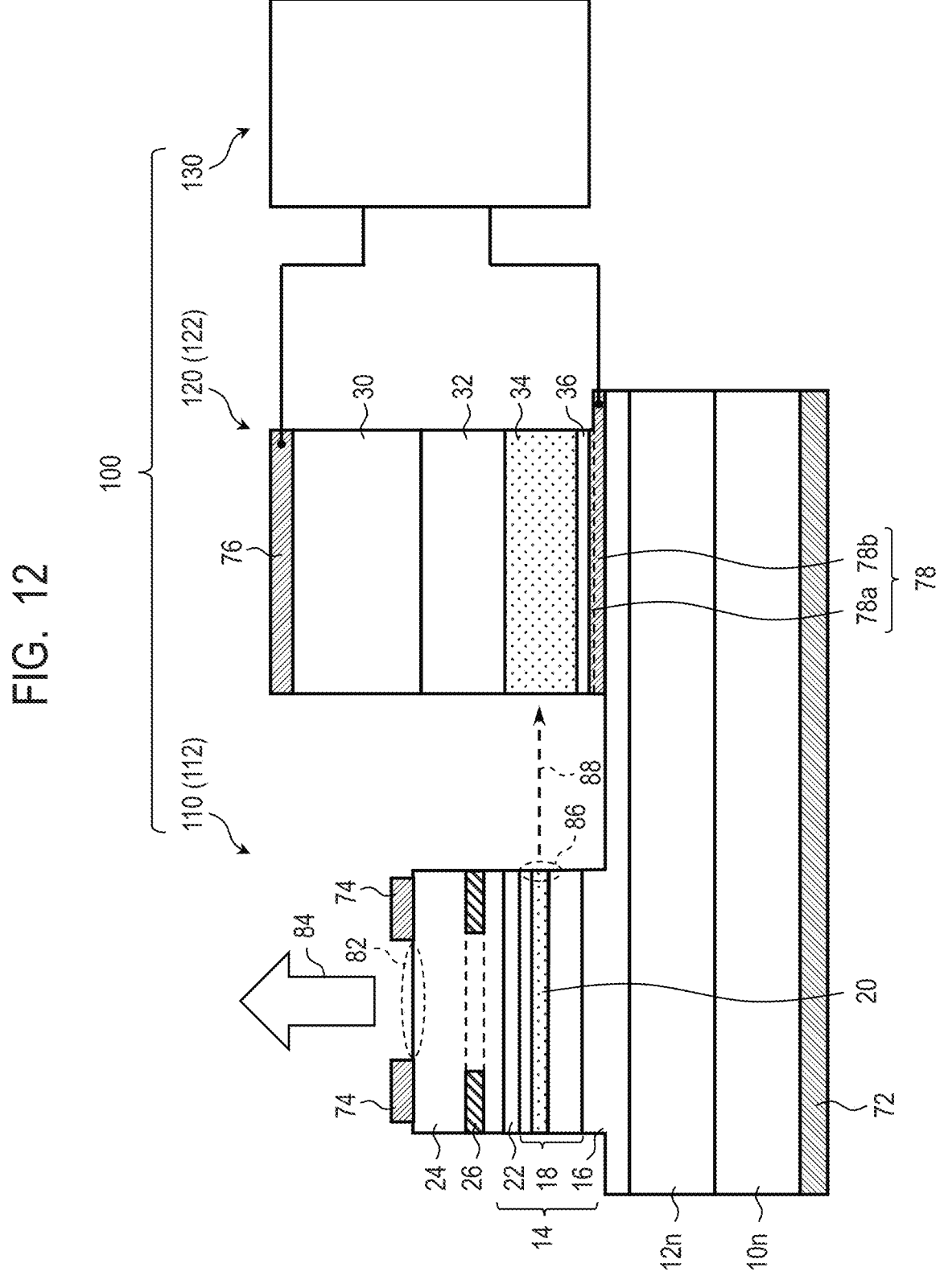
FIG. 12 is a schematic diagram illustrating a configuration example of a light source device according to a third embodiment of the present invention.
Figure 13:
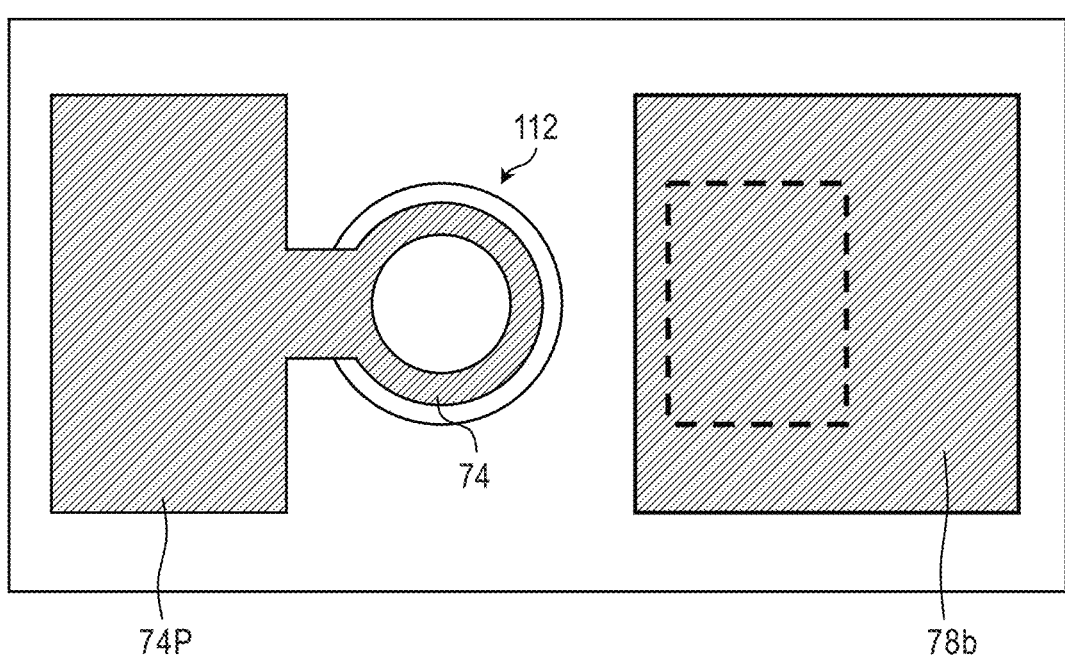
FIG. 13 is a top view illustrating a configuration example of the light source device according to the third embodiment of the present invention.

A light source device according to a third embodiment of the present invention will be described with reference to FIG. 12 and FIG. 13. The same components as those of the light source devices according to the first and second embodiments are denoted by the same reference numerals, and description thereof will be omitted or simplified. FIG. 12 is a schematic diagram illustrating a configuration example of the light source device according to the present embodiment. FIG. 13 is a top view illustrating a configuration example of the light source device according to the present embodiment.

The light source device 100 according to the present embodiment has the same basic configuration as the light source device 100 according to the first embodiment. The light source device 100 according to the present embodiment is different from the light source device 100 according to the first embodiment in that, as illustrated in FIG. 12, the light emitting element 112 and the light receiving element 122 are formed on the same semiconductor substrate 10$n$. However, the light source device 100 according to the present embodiment is different from the light source device 100 according to the second embodiment in that the light receiving element 122 formed on a semiconductor substrate different from the semiconductor substrate 10$n$ is bonded on the semiconductor substrate 10$n$.

That is, the light receiving element 122 of the present embodiment includes a semiconductor substrate 30 of a third conductivity type, a semiconductor layer 32 of the third conductivity type (for example, n-type), a light receiving layer 34, a semiconductor layer 36 of a fourth conductivity type (for example, p-type) different from the third conductivity type, and electrodes 76 and 78. The semiconductor layer 32, the light receiving layer 34, the semiconductor layer 36, and the electrode 78 are stacked in this order on one surface side of the semiconductor substrate 30. Thus, a photodiode having a p-i-n structure including the semiconductor layer 32, the light receiving layer 34, and the semiconductor layer 36 is formed. The electrode 76 is provided on the other surface side of the semiconductor substrate 30. The light receiving element 122 thus configured is bonded to the semiconductor substrate 10n provided with the light emitting element 112.

The light receiving element 122 of the present embodiment may be manufactured, for example, as follows.

First, a semiconductor layer 32, a light receiving layer 34, and a semiconductor layer 36 are epitaxially grown on a semiconductor substrate 30. Next, an electrode 78a is formed over the semiconductor layer 36. Further, an electrode 76 is formed on the rear surface side of the semiconductor substrate 30.

Next, the thus formed substrate for the timing monitor unit is turned over, and dicing is performed so as to obtain a predetermined area necessary for the light receiving element 122, and the individual light receiving elements 122 are picked up.

On the other hand, an electrode 78b is formed in advance in a portion of the substrate on which the light emitting element 112 is provided where the light receiving element 122 is to be disposed. FIG. 13 is a top view of the substrate provided with the light emitting element 112 before the light receiving element 122 is installed. A region indicated by a broken line in the electrode 78b is a portion where the light receiving element 122 is installed.

Next, the picked-up light receiving element 122 is bonded onto the electrode 78b with the side of the electrode 78a facing downward. The bonding between the light receiving element 122 and the substrate on which the light emitting element 112 is formed may be performed, for example, by a metallic bonding between gold forming the electrode 78a and gold forming the electrode 78b. The light receiving element 122 and the substrate on which the light emitting element 112 are formed are not necessarily bonded by metallic bonding, and may be fixed by using an adhesive or the like.

By configuring the light source device 100 in this manner, the light receiving layer 34 of the light receiving element 122 may be designed independently of the material, film thickness, area, and the like regardless of the epitaxial structure of the light emitting element 112. Since the height of the light receiving layer 34 may be set according to the thickness of each layer and the bonding accuracy, the light receiving layer 34 may be controlled at an appropriate position according to the position of the active layer 20 of the light emitting element 112.

From the viewpoint of efficiently detecting the spontaneous emission light 88 emitted from the active layer 20, the light receiving layer 34 is preferably disposed at a height including a height at which the active layer 20 is provided. The thickness of the light receiving layer 34 is preferably as large as possible, and the height of the center of the thickness of the light receiving layer 34 is ideally positioned at the height of the active layer 20. However, the center of the film thickness of the light receiving layer 34 may not necessarily be positioned at the height of the active layer 20 due to the limitation in etching the resonator portion 14 and the like and the limitation in disposing the light receiving element 122 on the substrate. Here, the height is a distance from the surface of the semiconductor substrate 10n.

In this case, for example, when the light receiving element 122 having the light receiving layer 34 made of a silicon layer having a thickness of 5 μm and an area of 30 μm×30 μm is disposed at a distance of 10 μm from the end portion of the light emitting element 112, the spontaneous emission light 88 can be detected at a S/N ratio of 100 or more.

When the height of the film thickness center of the light receiving layer 34 and the height of the active layer 20 do not match, it is necessary to consider components of the spontaneous emission light 88 that changes with respect to the height. Specifically, the light receiving sensitivity of the spontaneous emission light 88 is determined according to the volume of the light receiving layer 34, and the dark current is determined according to the area of the light receiving layer 34. Further, a detectable ratio of the component of the spontaneous emission light 88 emitted from the light emitting element 112 is determined based on the effect of FFP (Far Field Pattern) of the component of the spontaneous emission light 88 which changes depending on the height, in addition to the distance to the light emitting element 112. By comprehensively considering these, the element configuration and the distance between the elements are set such that the output of the light emission timing monitor 120 is not less than the dark current value.

In the configuration example of FIG. 12, the electrode 78 of the light receiving element 122 is formed at a height approximately equal to that of the resonator portion 14 of the light emitting element 112, but the electrode 78 may not be provided in the case where good electrical contact is obtained between the semiconductor layer 36 and the semiconductor substrate 10n. In this case, the electrode 72 may be used as a common electrode for the light emitting element 112 and the light receiving element 122.

Although one light emitting element 112 is included in the light emitting unit 110 in the present embodiment, the light emitting unit 110 may include a plurality of light emitting elements 112, as in the second embodiment.

As described above, according to the present embodiment, since the oscillation timing of the laser beam is detected using the spontaneous emission light, the accuracy of measuring the oscillation timing of the laser beam may be improved without lowering the light amount of the laser beam. Further, by mounting the light source device of the present embodiment in a LiDAR system, a LiDAR system with good distance measurement accuracy may be realized.

Fourth Embodiment

Figure 14:
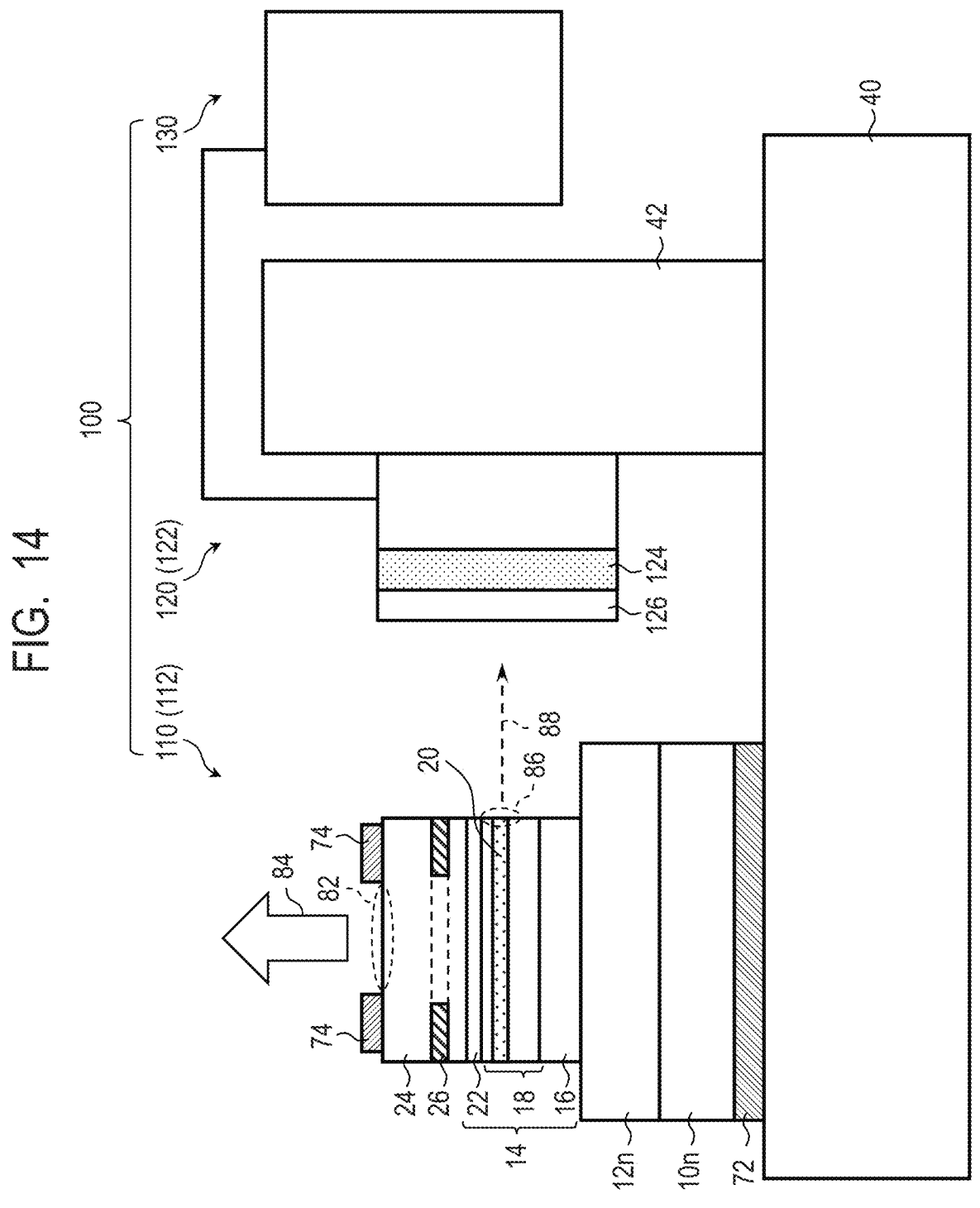
FIG. 14 is a schematic diagram illustrating a configuration example of a light source device according to a fourth embodiment of the present invention.

A light source device according to a fourth embodiment of the present invention will be described with reference to FIG. 14. The same components as those of the light source devices according to the first to third embodiments are denoted by the same reference numerals, and description thereof will be omitted or simplified. FIG. 14 is a schematic diagram illustrating a configuration example of the light source device according to the present embodiment.

In the light source device 100 according to the present embodiment, as illustrated in FIG. 14, the light emitting element 112 constituting the light emitting unit 110 and the light receiving element 122 constituting the light emission timing monitor 120 are configured by separate components. The light receiving element 122 may be formed of a photodiode having a p-i-n structure similar to that of the third embodiment. The light emitting element 112 is mounted on the substrate 40. The light receiving element 122 is supported by a support member 42 such as a stem so that the surface of the light receiving unit 124 faces the second portion 86 of the light emitting element 112, and is mounted on the substrate 40.

Figure 15:
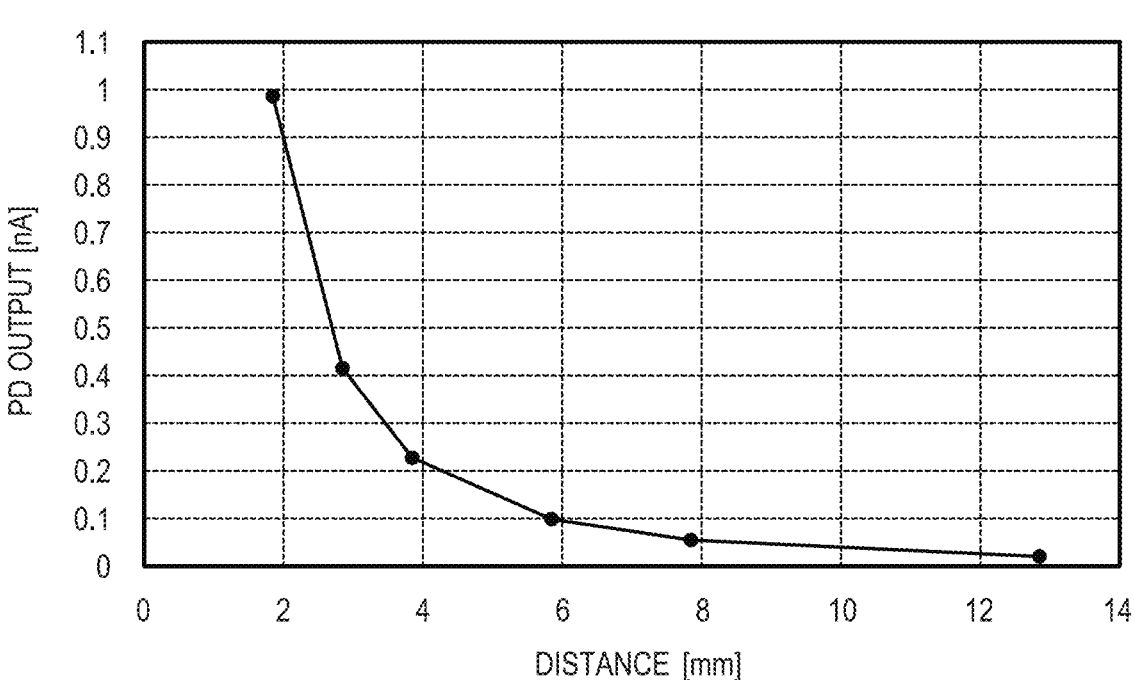
FIG. 15 is a graph illustrating a relationship between an output of the light receiving element and a distance between the light emitting element and the light receiving element.

Here, the relationship between a light amount of the spontaneous emission light 88 emitted from the light emitting element 112 and a distance between the second portion 86 and the light receiving unit 124 will be described with reference to FIG. 15. FIG. 15 is a graph illustrating the relationship between an output of the light receiving element 122 and a distance between the second portion 86 and the light receiving unit 124. In FIG. 15, the vertical axis represents the output (PD output) of the light receiving element 122, and the horizontal axis represents the distance between the second portion 86 and the light receiving unit 124. The amount of current injected into the light emitting element 112 used for the measurement was set to 1 mA that is equal to or less than the threshold current. Although the light receiving element 122 having a large light receiving area was used for the measurement, FIG. 15 illustrates a current value when the light receiving area was converted to φ0.1 mm.

As illustrated in FIG. 15, when the distance between the light emitting element 112 and the light receiving element 122 increases, the output of the light receiving element 122 decreases significantly. When the output of the light receiving element 122 is lower than the dark current value, the increase or decrease of the spontaneous emission light 88 cannot be detected. For example, in the case where the dark current is 100 pA in the light receiving element 122 having the light receiving area of φ0.1 mm, in the example of FIG. 15, when the light emitting element 112 and the light receiving element 122 are separated from each other by about 6 mm, the output of the light receiving element 122 and the magnitude of the dark current are substantially equal to each other. That is, since the S/N ratio is less than 1, it is difficult to detect the increase or decrease of the spontaneous emission light 88. On the other hand, when the distance between the light emitting element 112 and the light receiving element 122 is approximated to about 2 mm, the output of the light receiving element 122 can be increased to about 10 times the dark current.

When the distance between the second portion 86 of the light emitting element 112 and the light receiving unit 124 of the light receiving element 122 is L [m], it is preferable that the distance L satisfy the following expression (1). In the expression (1), P [W] is a total amount of spontaneous emission light 88 emitted from the second portion 86, S [m²] is a light receiving area of the light receiving unit 124 of the light receiving element 122, Q [A/W] is a light receiving sensitivity of the light receiving element 122, and Da [A] is a dark current value of the light receiving element 122.

$$P \times (S/4\pi L^2) \times Q > Da \qquad (1)$$

Although it has been described that the spontaneous emission light 88 from the light emitting element 112 is incident on the light receiving unit 124, in practice, a part of the laser beam 84 may enter the light receiving unit 124 due to reflection from an optical system (not illustrated). In such a case, for example, as illustrated in FIG. 14, the wavelength filter 126 may be disposed on the incident surface side of the spontaneous emission light 88 to the light receiving unit 124.

Here, setting of the transmission wavelength band of the wavelength filter 126 when the spontaneous emission light 88 and the laser beam 84 are separated using the wavelength filter 126 will be described.

Figure 16:
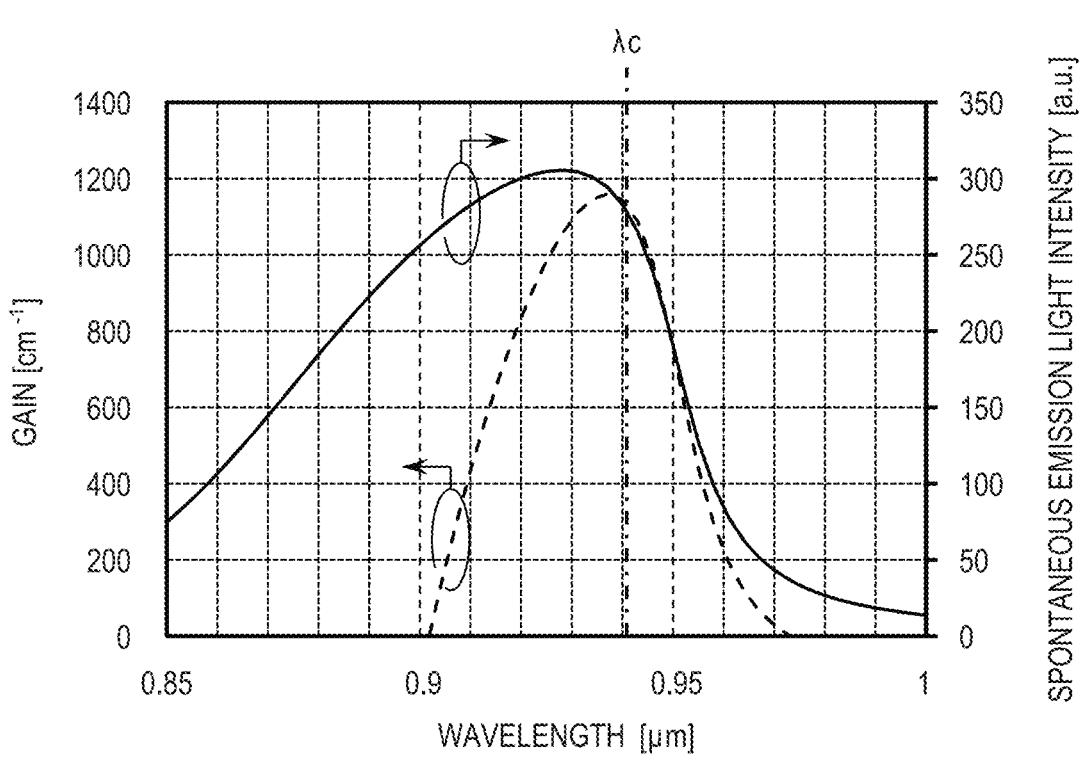
FIG. 16 and FIG. 17 are graphs illustrating gain spectrum and spontaneous emission spectrum of the light emitting element.

FIG. 16 is a graph illustrating results obtained by calculating gain spectrum and spontaneous emission light spectrum in a quantum well in which an InGaAs layer having a transition wavelength of 940 nm between ground levels is used as a well layer. In FIG. 16, the gain spectrum is represented by a broken line, and the spontaneous emission light spectrum is represented by a solid line.

As illustrated in FIG. 16, the peak wavelength of the gain spectrum is approximately 940 nm. Therefore, in the case of the optimized design in the state illustrated in FIG. 16, the resonance wavelength λc of the surface emitting laser is set to a wavelength around 940 nm where the highest gain can be obtained the laser beam can be efficiently extracted. On the other hand, the spontaneous emission light has a spectrum shape that is larger in spread on the shorter wavelength side than the wavelength of 940 nm. Therefore, it is preferable to use a so-called short-pass filter that transmits light of a shorter wavelength side than a specific wavelength λco and reflects or absorbs light of a longer wavelength side than the wavelength λco as an optical filter for shielding the laser beam and transmitting only a large amount of spontaneous emission light.

Since the spectral width of the laser beam generally falls within 5 nm or less, the wavelength λco may satisfy the relationship of the following expression (2).

$$\lambda co < \lambda c - 5 \text{ [nm]} \qquad (2)$$

However, actually, a manufacturing variation of about ±10 nm may occur in the resonance wavelength λc of the surface emitting laser. In addition, it is necessary to consider the manufacturing variation of the short-pass filter and the wavelength width (about 10 nm) required for reducing the intensity of the transmitted light to around 0 in the vicinity of the wavelength λco. From such a viewpoint, it is more preferable that the wavelength λco satisfy the relationship of the following expression (3).

$$\lambda co \leq \lambda c - 30 \text{ [nm]} \qquad (3)$$

According to the expression (3), when the resonance wavelength λc is 940 nm, the wavelength λco is 910 nm. In FIG. 16, since the spectrum of the spontaneous emission light spreads to the shorter wavelength side than the wavelength of 910 nm, it can be understood that only the spontaneous emission light can be detected and the oscillation timing can be detected by using the optical filter having the wavelength λco of 910 nm.

Incidentally, in many cases, the surface emitting laser is designed by shifting the gain peak wavelength at room temperature to a short wavelength side so that the laser oscillation wavelength and the gain peak wavelength approach each other when the temperature rises. The shift amount of the gain peak wavelength at room temperature is generally set to about 20 nm. In such a case, the peak wavelength of the gain spectrum of the active layer 20 is designed to be on the short wavelength side by about 20 nm with respect to the resonance wavelength λc of the surface emitting laser.

Figure 17:
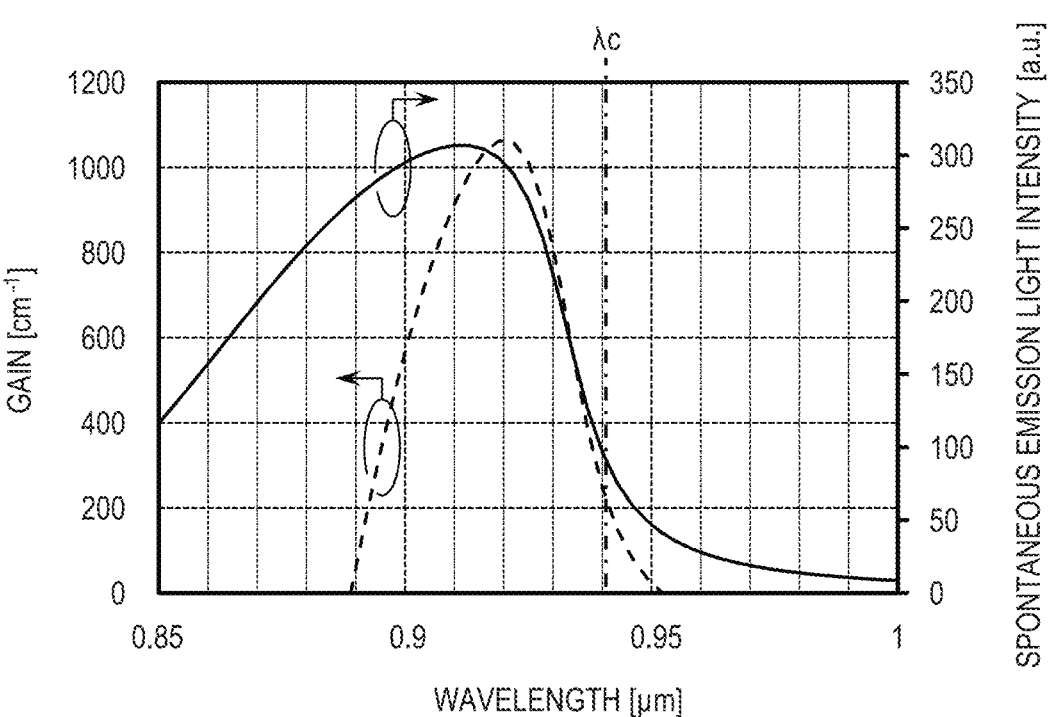

FIG. 17 is a graph illustrating calculation results of a gain spectrum and a spontaneous emission light spectrum when the gain peak wavelength is shifted to the short wavelength side by 20 nm.

In this case, since the resonance wavelength λc is around 940 nm at room temperature, the wavelength λco is preferably less than λc−5 nm and more preferably less than or equal to λc−30 nm, as in the case described above. In the room temperature state, it can be understood that the amount of components of the spontaneous emission light on the shorter wavelength side than a specific wavelength, for example, 910 nm, which is the wavelength $\lambda$co. Therefore, at room temperature, more spontaneous emission light can be used to detect the oscillation timing. Further, since the relationship between the gain spectrum and the spontaneous emission light spectrum approaches the state illustrated in FIG. 16 at a high temperature, it is possible to transmit only the spontaneous emission light even at a high temperature and thereby detect the oscillation timing.

When the light amount of the spontaneous emission light 88 incident on the light receiving unit 124 is reduced by the wavelength filter 126, the distance L may be calculated by using a total amount P' obtained by subtracting an amount reduced by the wavelength filter 126 from the total amount P of the spontaneous emission light as the total amount P of the parameters in the expression (1).

Although one light emitting element 112 is included in the light emitting unit 110 in the present embodiment, the light emitting unit 110 may include a plurality of light emitting elements 112, as in the second embodiment.

As described above, according to the present embodiment, since the oscillation timing of the laser beam is detected using the spontaneous emission light, the accuracy of measuring the oscillation timing of the laser beam may be improved without lowering the light amount of the laser beam. Further, by mounting the light source device of the present embodiment in a LiDAR system, a LiDAR system with good distance measurement accuracy may be realized.

Fifth Embodiment

Figure 18:
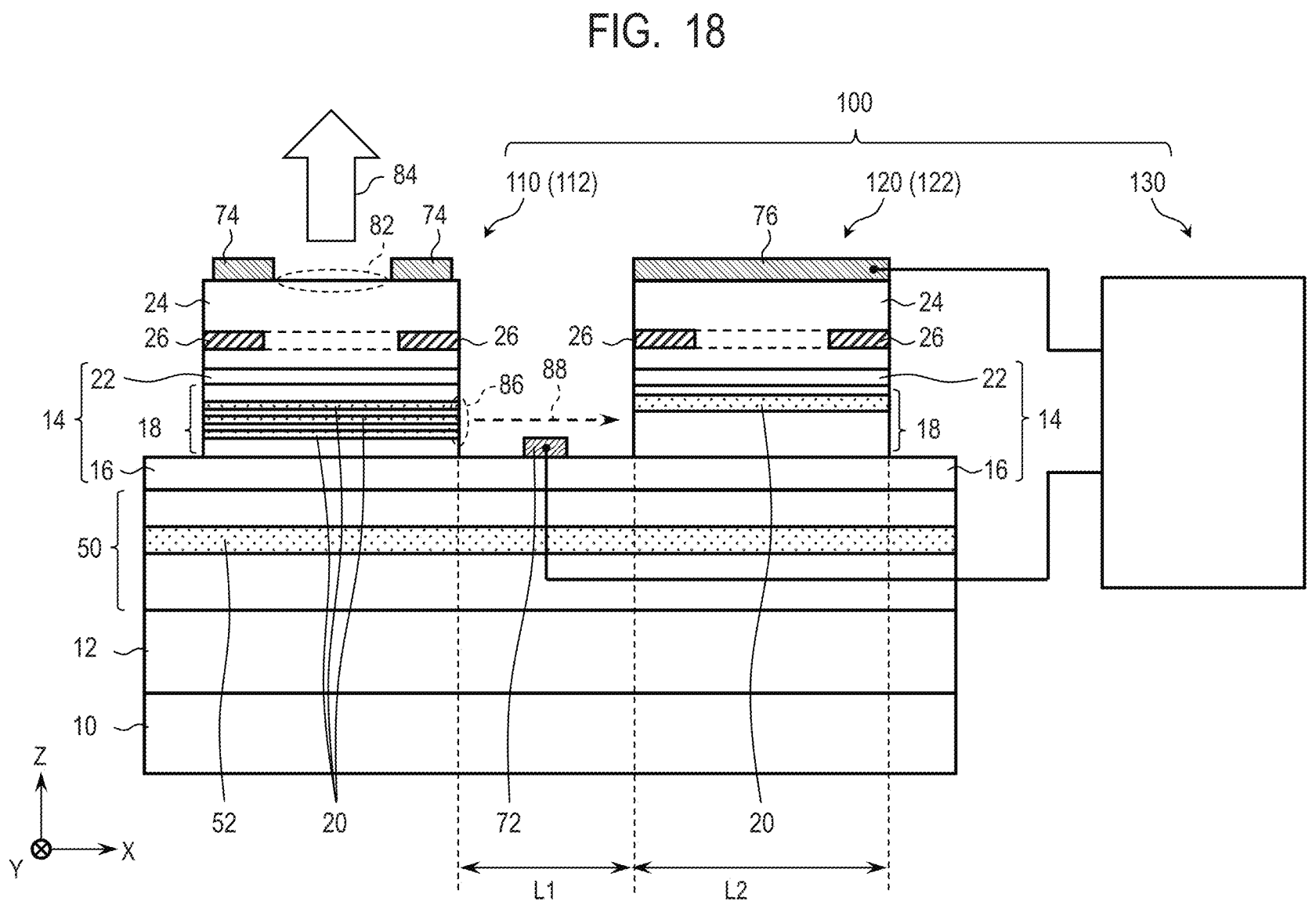

A light source device according to a fifth embodiment of the present invention will be described with reference to FIG. 18. The same components as those of the light source devices according to the first to fourth embodiments are denoted by the same reference numerals, and description thereof will be omitted or simplified. FIG. 18 is a schematic diagram illustrating a configuration example of the light source device according to the present embodiment.

The light source device 100 according to the present embodiment is different from the light source device 100 according to the second embodiment in the configuration of the light emitting element 112. That is, as illustrated in FIG. 18, the light emitting element 112 of the present embodiment further includes a non-doped spacer portion 50 having a saturable absorption layer 52 between the lower DBR layer 12 and the semiconductor layer 16. Additionally, the non-doped spacer portion 18 includes three active layers 20. A layer located between the lower DBR layer 12 and the upper DBR layer 24 (non-doped spacer portion 50 and resonator portion 14) is a resonator spacer portion. The electrode 72 is provided on the semiconductor layer 16 and is in ohmic contact with the semiconductor layer 16. The other points are the same as those of the light source device 100 according to the second embodiment.

The resonator portion 14 is composed of a p-i-n junction including a semiconductor layer 16 of a first conductivity type (for example, n-type), a non-doped spacer portion 18, and a semiconductor layer 22 of a second conductivity type (for example, p-type). Each of the three active layers 20 arranged in the non-doped spacer portion 18 may be composed of, for example, a multiple quantum well including four quantum wells each including an InGaAs well layer having a thickness of 8 nm sandwiched between AlGaAs barrier layers having a thickness of 10 nm. In this case, the resonator portion 14 includes a total of 12 quantum wells. The semiconductor layer 16 may be formed of an n-type GaAs layer, the semiconductor layer 22 may be formed of a p-type GaAs layer, and the other portions of the non-doped spacer portion 18 may be formed of a non-doped AlGaAs layer.

The resonator portion 14 is composed of a p-i-n junction existing also in a general VCSEL, and has a configuration similar to that of a resonator portion including an active layer in an i-layer. However, the number of quantum well layers included in the resonator portion 14 is larger than the number of quantum well layers included in a general VCSEL (about three layers). The effective resonator length in the resonator portion 14 is 10 $\mu$m.

In the present embodiment, the three layers of the active layer 20 are arranged not at the antinode position of the standing wave used in the design of the general VCSEL but at the position between the antinode and the node of the standing wave. This makes it possible to optimize the response characteristics of light when the driving current is injected. Further, the optical confinement coefficient for the standing wave is generally in the range of 1.5 to 2.0 in the general VCSEL, but in the present embodiment, the optical confinement coefficient is intentionally set to be as low as about 0.35. Further, the AlGaAs barrier layer is designed to have a smaller band gap than the barrier layer in the quantum well of the general VCSEL, whereby carriers are accumulated also in the barrier layer. Thus, the number of layers of the InGaAs well layer in which carriers are accumulated is 12, but carriers are accumulated also in the AlGaAs barrier layer, whereby carriers of amount corresponding to approximately 20 layers of normal quantum well can be accumulated. The Al composition of AlGaAs as the barrier layer is preferably 0 to 30%.

The non-doped spacer portion 50 does not exist in the general VCSEL. The saturable absorption layer 52 may be composed of, for example, a multiple quantum well including three quantum wells each including an InGaAs well layer having a thickness of 8 nm sandwiched between AlGaAs barrier layers having a thickness of 10 nm. The other portion of the non-doped spacer portion 50 may be composed of a non-doped GaAs layer.

Next, the operation of the light emitting element 112 of the present embodiment will be described with reference to FIG. 2 to FIG. 4.

FIG. 2 and FIG. 3 are graphs illustrating the results obtained by calculation of the light output waveform of the light emitting element. FIG. 2 is a light output waveform of the light emitting element according to the comparative example, and FIG. 3 is a light output waveform of the light emitting element 112 according to the present embodiment. The light emitting element according to the comparative example is a VCSEL having a general structure in which a saturable absorption layer is not provided, three quantum wells are provided, and a resonator length is 1$\lambda$.

In the case of a general semiconductor light emitting device configuration, as illustrated in FIG. 2, oscillation starts at about 70 ps from the start of current injection, and the light output rises. Then, the light output reaches the peak of the light waveform accompanying the relaxation vibration, and then converges to a steady value.

On the other hand, the light emitting element 112 according to the present embodiment emits light having a maximum peak value and a profile that converges to a stable value that is a predetermined light intensity after the maximum peak value. That is, in the light emitting element 112 according to the present embodiment, for example, as illustrated in FIG. 3, oscillation starts after about 600 psec has elapsed from the start of current injection. The lag in the start of oscillation is due to the fact that the effective volume of the active layer 20 is increased, and the fact that oscillation is inhibited by absorption of light in the saturable absorption layer 52 for a certain period of time from the start of current injection. When light is absorbed by the saturable absorption layer 52, the absorbed light is accumulated as carriers in the saturable absorption layer 52. When carriers increase with light absorption and the carrier density in the saturable absorption layer 52 reaches the transparent carrier density, the saturable absorption layer 52 does not absorb light. As a result, the effect of blocking the laser oscillation is eliminated, and the semiconductor light emitting element starts the laser oscillation.

The purpose of the saturable absorption layer 52 preventing laser oscillation for a certain period of time is to accumulate carriers exceeding the threshold carrier density in the active layer 20. Here, the threshold carrier density is a carrier density for generating a gain necessary for laser oscillation.

FIG. 4 is a graph illustrating temporal changes in density of carriers accumulated in the active layer 20 and light intensity. The current injected into the light emitting element 112 has a waveform similar to that of FIG. 3, and the injection is started from a time point of 4E-10 seconds on the time axis.

As illustrated in FIG. 4, the carrier density of the active layer 20 begins to increase with the start of current injection. Although the threshold carrier density (carrier density converged after the start of oscillation) in the light emitting element 112 of the present embodiment is $2.7E+18$ cm$^{-3}$, carriers continue to accumulate temporarily beyond the threshold carrier density in a state before the start of laser oscillation. Thereafter, when laser oscillation starts, carriers are rapidly consumed by stimulated emission and converge to a stable value.

Thus, in the light emitting element 112 of the present embodiment, more carriers are accumulated in the active layer 20 beyond the threshold carrier density. Then, carriers accumulated in the active layer 20 after the start of laser oscillation are converted into photons by stimulated emission. This makes it possible to output a light pulse having a high peak value and a short width at half maximum as illustrated in FIG. 3.

The reason why carriers having a carrier density equal to or higher than the threshold carrier density can be accumulated in the active layer 20 is that laser oscillation is suppressed for a certain period of time by using the saturable absorption layer 52. By realizing such a high carrier density, a light pulse having a high peak value and a short pulse width can be generated inside the light emitting element after oscillation. This light pulse is shorter than the current pulse for driving the light emitting element 112. In this example, the peak light amount of the laser beam is three times or more the light amount of the laser beam at the steady state.

As a comparison, the operation principle of a general VCSEL will be described with reference to FIG. 19.

Figure 19:
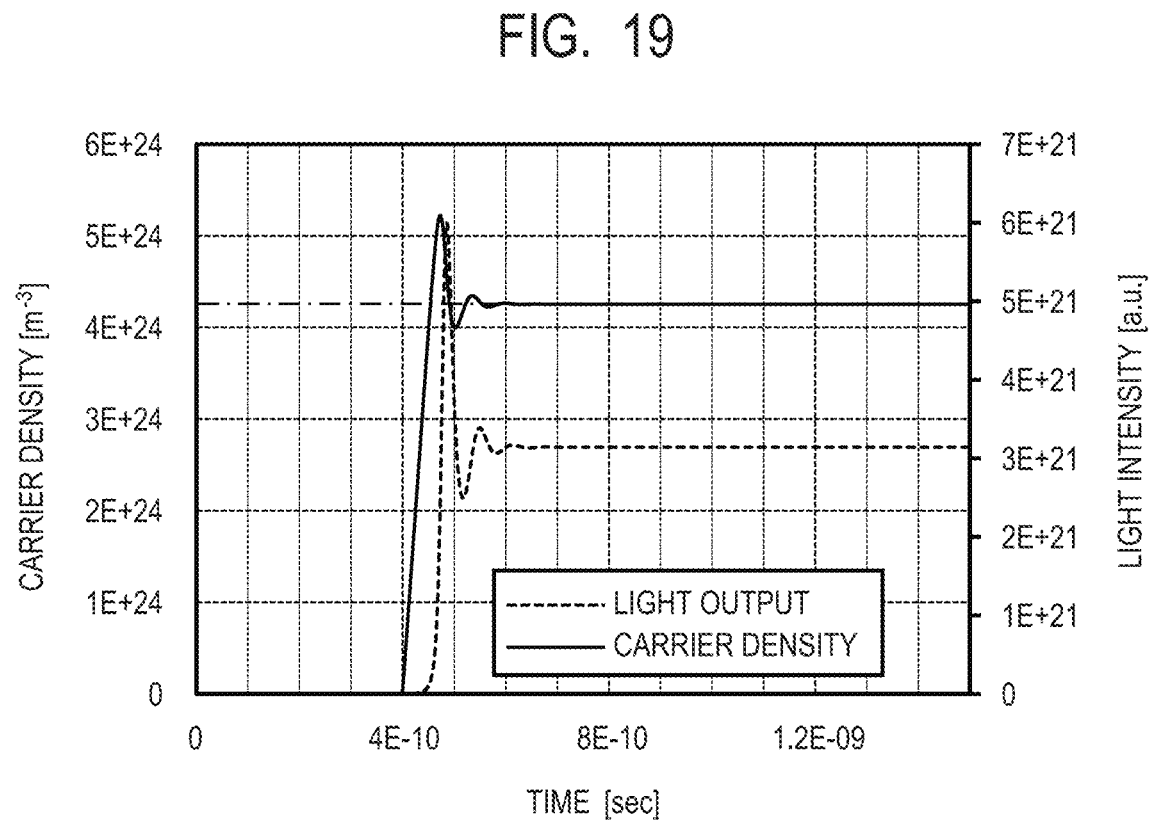

Also in the case of the general VCSEL, as in the case of the light emitting element 112 of the present embodiment, current injection is started and the carrier density of the active layer rises to a threshold carrier density (indicated by a one-dot-chain line in FIG. 19). In a state before the laser oscillation starts, the carrier density temporarily continues to accumulate beyond the threshold carrier density. Then, oscillation starts, and carriers are rapidly consumed by stimulated emission and converge to a stable value.

When the characteristics of the general VCSEL illustrated in FIG. 19 are compared with the characteristics of the light emitting element 112 of the present embodiment illustrated in FIG. 4, in the general VCSEL, the length of the period during which carriers are accumulated beyond the threshold carrier density and the length of the period during which carriers are rapidly consumed by stimulated emission are extremely short. The timing at the intensity peak of the spontaneous emission light and the oscillation timing of the laser beam are substantially the same. The peak light amount of the laser beam is about twice the light amount of the laser beam in a steady state.

Note that the times illustrated in FIG. 4 and FIG. 19 are merely examples, and when the structure of the light emitting element is changed, the lengths of these times and periods are also different. For example, by increasing the number and volume of well layers, the accumulation time of carriers becomes longer under the same current injection condition.

Next, an example of a method of manufacturing the light emitting element 112 according to the present embodiment will be described below.

First, semiconductor layers constituting the lower DBR layer 12, the non-doped spacer portion 50, the resonator portion 14, and the upper DBR layer 24 are grown on the semiconductor substrate 10 by a metal organic vapor phase epitaxy method or a molecular beam epitaxy method.

Next, the upper DBR layer 24, the semiconductor layer 22, and the non-doped spacer portion 18 are patterned by photolithography and etching. Thus, a columnar mesa having a diameter of, e.g., about 30 μm is formed.

Next, thermal oxidation is performed in a water vapor atmosphere of about 450° C. to oxidize the Al$_{0.98}$Ga$_{0.02}$As layer in the upper DBR layer 24 from the sidewall portion of the mesa to form the oxidized constriction layer 26. At this time, by controlling the oxidation time, a non-oxidized portion in the central portion of the mesa and an oxidized portion (oxidized constriction layer 26) in the vicinity of the sidewall of the mesa are formed in the Al$_{0.98}$Ga$_{0.02}$As layer. The non-oxidized portion of the Al$_{0.98}$Ga$_{0.02}$As layer is controlled to have a diameter of about 10 μm.

Next, an electrode 74 serving as a p-side electrode is formed on the upper surface of the mesa by using photolithography and vacuum evaporation method, and an electrode 72 serving as an n-side electrode is formed on the upper surface of the semiconductor layer 16 exposed by etching. The electrode 74 has an annular pattern, and a central opening becomes a circular window for light extraction.

Next, a protection film (not illustrated) is formed by using photolithography and plasma CVD method to cover the upper surface and the side surface of the mesa provided with the electrodes 72 and 74 and the upper surface of the semiconductor layer 16.

Next, in order to obtain favorable electric characteristics, heat treatment is performed in a nitrogen atmosphere to alloy the interface between the electrode material and the semiconductor material, thereby completing the light emitting element 112 of the present embodiment.

Similarly to the second embodiment, the light emitting element 112 and the light receiving element 122 may be separated by dry etching, wet etching, or the like. A part in the plane of the chip surface of the layers above the upper side of the semiconductor layer 16 is removed during processing, and the remaining part is mesa-shaped. In the example of FIG. 18, the upper DBR layer 24 to the non-doped spacer portion 18 are processed into a mesa shape, but the depth at which the light emitting element 112 and the light receiving element 122 are separated from each other is not necessarily limited to this example. That is, it is sufficient that the light emitting element 112 is configured so as to perform laser oscillation at the center portion thereof, and it is sufficient that the light emitting element 112 and the light receiving element 122 are separated from each other at least in a region up to the side of the semiconductor substrate 10n of the oxidized constriction layer 26.

The electrode 72 is common to the light emitting element 112 and the light receiving element 122. The light emitting element 112 is driven by a forward bias voltage applied between the electrodes 72 and 74. Since the current injected into the light emitting element 112 flows only in the non-oxidized portion of the central portion of the mesa where the oxidized constriction layer 26 is not provided, laser oscillation occurs only in the portion of the light emitting element 112 overlapping the central portion of the mesa in a plan view. The light receiving element 122 is driven by a reverse bias voltage applied between the electrode 72 and the electrode 76, and detects the amount of the spontaneous emission light 88 incident on the active layer 20 (light receiving unit 124). The determination unit 130 detects the oscillation timing of the laser beam 84 based on the light quantity information for each time received from the light receiving element 122 (the light emission timing monitor 120).

Although one light emitting element 112 is included in the light emitting unit 110 in the present embodiment, the light emitting unit 110 may include a plurality of light emitting elements 112, as in the second embodiment.

Further, in the present embodiment, an example in which the light emission timing monitor 120 is configured by the light receiving element 122 of the second embodiment is described, but the light receiving element 122 constituting the light emission timing monitor 120 is not limited thereto. The light receiving element 122 constituting the light emission timing monitor 120 may be the light receiving element 122 described in the other embodiments.

As described above, according to the present embodiment, since the oscillation timing of the laser beam is detected using the spontaneous emission light, the accuracy of measuring the oscillation timing of the laser beam may be improved without lowering the light amount of the laser beam. Further, by mounting the light source device of the present embodiment in a LiDAR system, a LiDAR system with good distance measurement accuracy may be realized.

Sixth Embodiment

Figure 20:
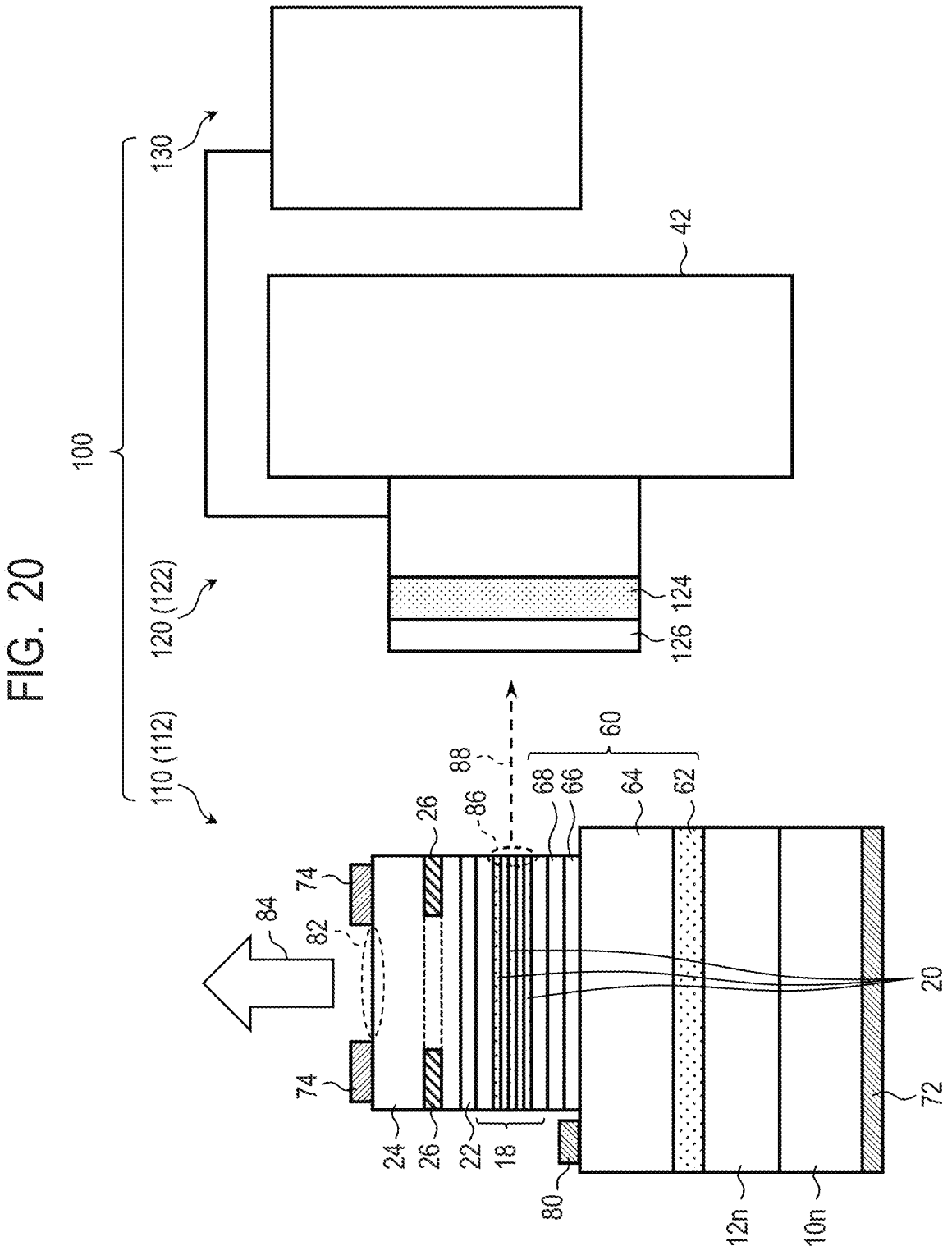
FIG. 20 is a schematic diagram illustrating a configuration example of a light source device according to a sixth embodiment of the present invention.

A light source device according to a sixth embodiment of the present invention will be described with reference to FIG. 20. The same components as those of the light source devices according to the first to fifth embodiments are denoted by the same reference numerals, and description thereof will be omitted or simplified. FIG. 20 is a schematic diagram illustrating a configuration example of a light source device according to the present embodiment.

The light source device 100 according to the present embodiment is different from the light source device 100 according to the previous embodiments in the configuration of the light emitting element 112. That is, as illustrated in FIG. 20, the light emitting element 112 of the present embodiment includes a semiconductor substrate 10n of a first conductivity type (for example, an n-type), a lower DBR layer 12n of a first conductivity type, an active region 60, a non-doped spacer portion 18, a semiconductor layer 22, and an upper DBR layer 24. The light emitting element 112 of this embodiment further includes electrodes 72, 74, and 80. The lower DBR layer 12n, the active region 60, the non-doped spacer portion 18, the semiconductor layer 22, and the upper DBR layer 24 are stacked in this order on one surface side of the semiconductor substrate 10n.

The active region 60 includes, in order from the lower DBR layer 12n side, a saturable absorption layer 62, a junction layer 64 of a second conductivity type (for example, p-type), a tunnel junction portion 66, and a junction layer 68 of a first conductivity type. The tunnel junction portion 66 includes a highly doped semiconductor layer of the second conductivity type (e.g., a $p^{++}$ semiconductor layer) in contact with the junction layer 64 and a highly doped semiconductor layer of the first conductivity type (e.g., an $n^{++}$ semiconductor layer) in contact with the highly doped semiconductor layer of the second conductivity type and the junction layer 68. The junction of these highly doped semiconductor layers constitutes a tunnel junction.

Since charge carriers move from the valence band to the conduction band and are effectively recirculated in the tunnel junction portion 66, the active layer structure of the non-doped spacer portion 18 is also pumped by electrons from one side and holes from the other side as well as the saturable absorption layer 62. In the present embodiment, an electrode 80 is further provided between the saturable absorption layer 62 and the tunnel junction portion 66 so that the current flowing through the saturable absorption layer 62 and the active layer structure of the non-doped spacer portion 18 can be controlled separately.

That is, the light emitting element 112 of the present embodiment is a three-electrode VCSEL having electrodes 72, 74, and 80. With such a three-electrode configuration, the oscillation timing of the laser beam may be controlled more easily. However, since the driving timing of the driver and the oscillation timing of the laser beam are shifted due to environmental changes such as temperature, the configuration of the present embodiment having a mechanism for measuring the oscillation timing of the laser beam is effective.

Although one light emitting element 112 is included in the light emitting unit 110 in the present embodiment, the light emitting unit 110 may include a plurality of light emitting elements 112, as in the second embodiment.

Further, in the present embodiment, an example in which the light emission timing monitor 120 is configured by the light receiving element 122 of the fourth embodiment is described, but the light receiving element 122 constituting the light emission timing monitor 120 is not limited thereto. The light receiving element 122 constituting the light emission timing monitor 120 may be the light receiving element 122 described in the other embodiments.

As described above, according to the present embodiment, since the oscillation timing of the laser beam is detected using the spontaneous emission light, the accuracy of measuring the oscillation timing of the laser beam may be improved without lowering the light amount of the laser beam. Further, by mounting the light source device of the present embodiment in a LiDAR system, a LiDAR system with good distance measurement accuracy may be realized.

Seventh Embodiment

Figure 21:
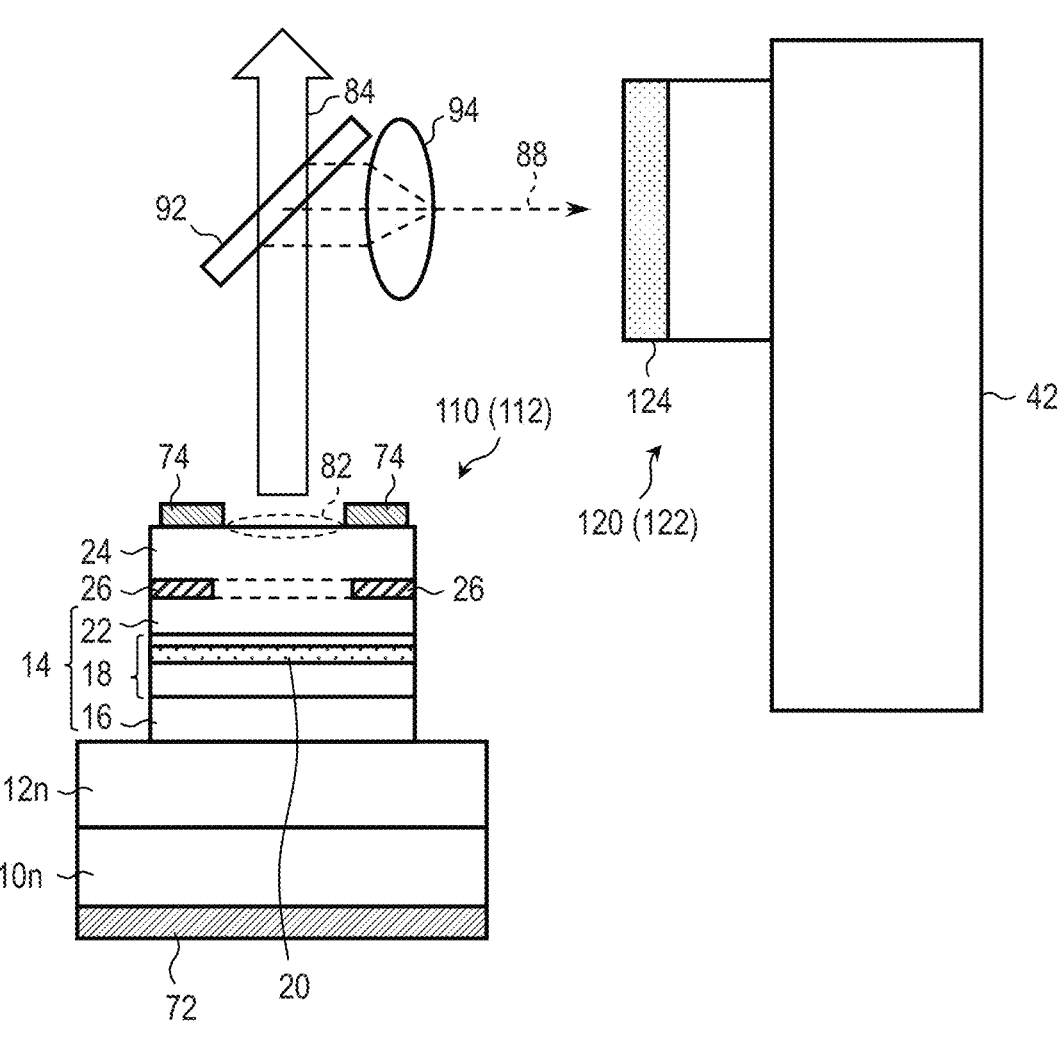
FIG. 21 and FIG. 22 are schematic views illustrating configuration examples of a light source device according to a seventh embodiment of the present invention.
Figure 22:
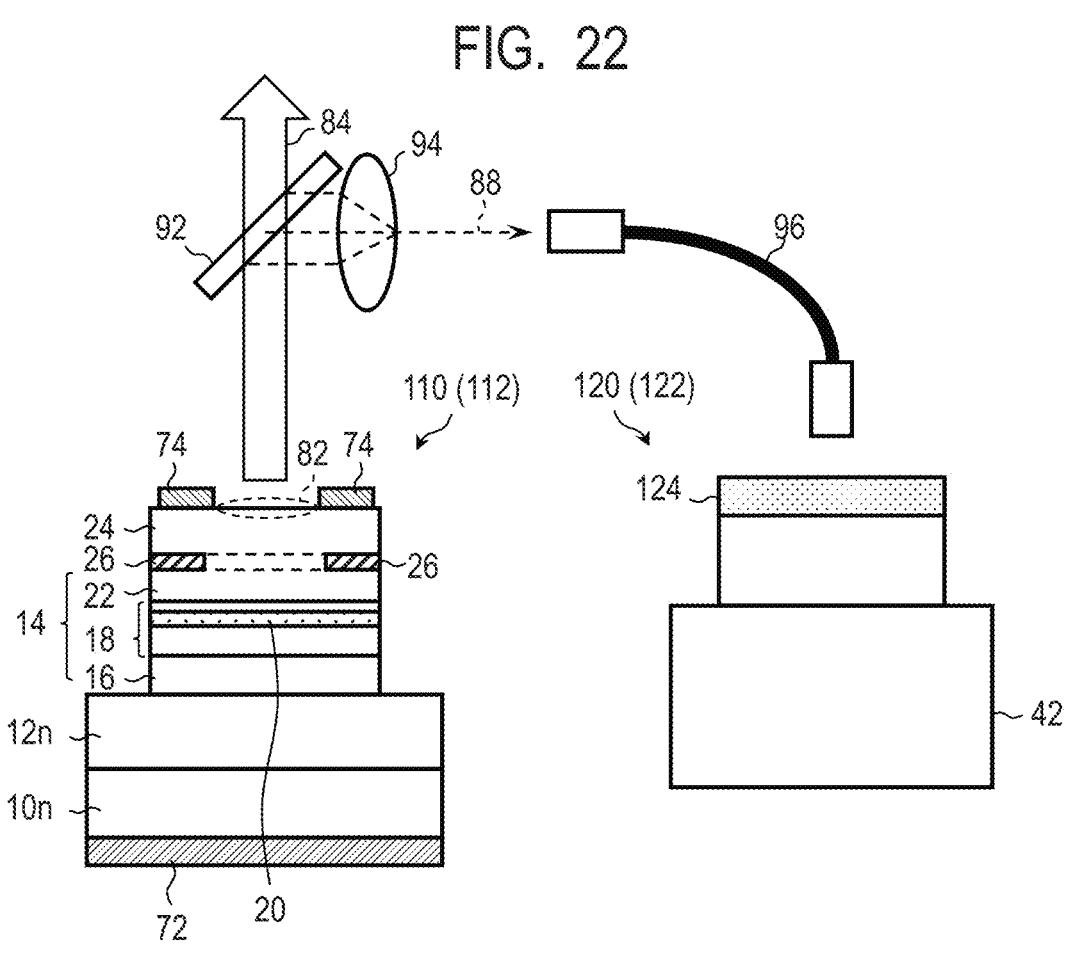

A light source device according to a seventh embodiment of the present invention will be described with reference to FIG. 21 and FIG. 22. The same components as those of the light source devices according to the first to sixth embodiments are denoted by the same reference numerals, and description thereof will be omitted or simplified. FIG. 21 and FIG. 22 are schematic diagrams illustrating configuration examples of the light source device according to the present embodiment.

In the first to sixth embodiments, the spontaneous emission light 88 emitted from the second portion 86 of the light emitting element 112 is detected by the light receiving element 122, but it is also possible to detect the spontaneous emission light 88 emitted from the first portion 82 of the light emitting element 112 by the light receiving element 122. In the present embodiment, a configuration example of the light source device 100 in which the light receiving element 122 detects the spontaneous emission light 88 emitted from the first portion 82 of the light emitting element 112 will be described.

Although the light emitting element 112 and the light receiving element 122 applicable to the present embodiment are not particularly limited, it is assumed here that the light source device 100 is configured by combining the light emitting element 112 of the second embodiment and the light receiving element 122 of the fourth embodiment. In FIG. 21 and FIG. 22, the determination unit 130 is omitted.

Although a light emitted from the first portion 82 of the light emitting element 112 mainly includes the laser beam 84, a component of the spontaneous emission light 88 is partially contained in the light. Therefore, it is possible to detect the spontaneous emission light 88 included in the laser beam 84 and to detect the timing of the laser oscillation based on the detected spontaneous emission light 88.

The configuration example of FIG. 21 is an example of a light source device in which the light emitted from the first portion 82 of the light emitting element 112 is split into the laser beam 84 and the spontaneous emission light 88 by using the wavelength filter 92, and the separated spontaneous emission light 88 is condensed by the lens 94 and incident on the light receiving element 122. The wavelength filter 92 has an optical characteristic of transmitting the laser beam 84 and reflecting the spontaneous emission light 88, and it is preferable to use a so-called long pass filter that reflects light of a shorter wavelength side than a specific wavelength λco and transmits light of a longer wavelength side than the wavelength λco.

In this configuration example, since the light is collected using the lens 94, the light receiving area of the light receiving element 122 for obtaining the same signal intensity may be reduced. Since the value of the dark current is substantially proportional to the light receiving area, the S/N ratio may be increased by reducing the light receiving area. In general, since high-speed response is possible by reducing the light-receiving area, it is preferable to reduce the light-receiving area from the viewpoint of response performance.

The configuration example of FIG. 22 is different from the configuration example of FIG. 21 in that an optical fiber 96 is further added between the lens 94 and the light receiving element 122. By employing the optical fiber 96 to guide the light passing through the lens 94 to the light receiving element 122, the degree of freedom of the arrangement of the light emitting element 112 and the light receiving element 122 may be greatly improved.

Although the case where the light emitting unit 110 includes one light emitting element 112 is exemplified in the present embodiment, the light emitting unit 110 may include a plurality of light emitting elements 112 as in the case of the second embodiment. In this case, the wavelength filter 92 and the lens 94 may be provided for each of the plurality of light emitting elements 112, or may be provided one for the plurality of light emitting elements 112.

As described above, according to the present embodiment, since the oscillation timing of the laser beam is detected using the spontaneous emission light, the accuracy of measuring the oscillation timing of the laser beam may be improved without lowering the light amount of the laser beam. Further, by mounting the light source device of the present embodiment in a LiDAR system, a LiDAR system with good distance measurement accuracy may be realized.

Eighth Embodiment

Figure 23:
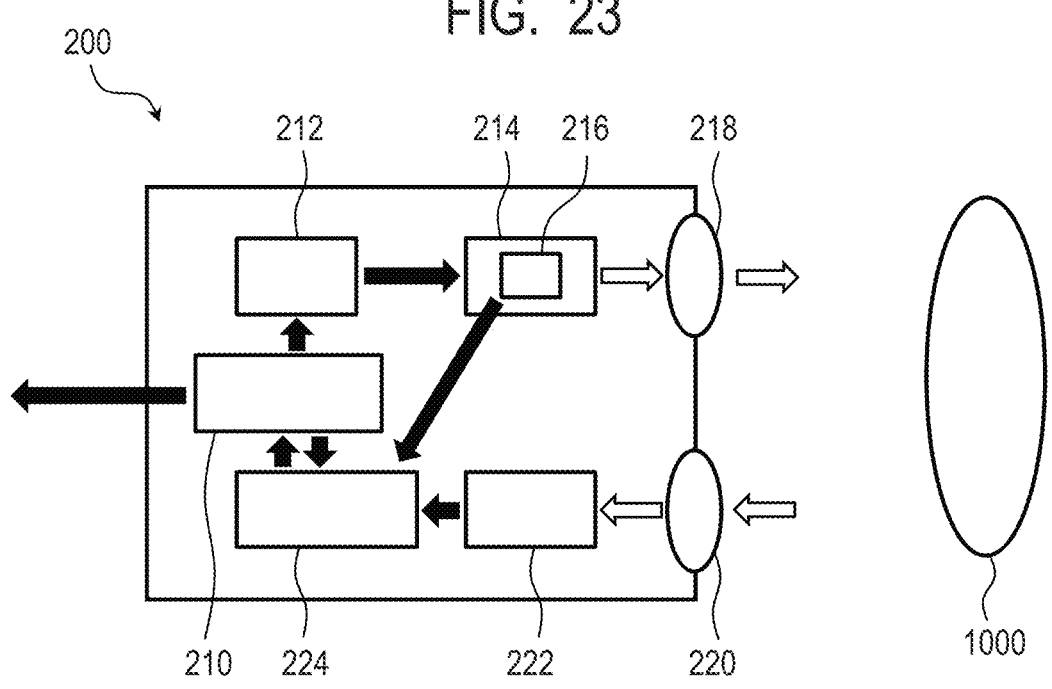
FIG. 23 is a block diagram illustrating a schematic configuration of a distance measuring device according to an eighth embodiment of the present invention.

A distance measuring device according to an eighth embodiment of the present invention will be described with reference to FIG. 23. The same components as those of the light source devices according to the first to seventh embodiments are denoted by the same reference numerals, and description thereof will be omitted or simplified. FIG. 23 is a block diagram illustrating a schematic configuration of the distance measuring device according to the present embodiment.

The distance measuring device 200 according to the present embodiment is a distance measuring device (LiDAR device) in which the light source device 100 according to any one of the first to seventh embodiments is applied to a light source unit.

The distance measuring device 200 according to the present embodiment may include a control unit 210, a surface emitting laser array driver 212, a surface emitting laser array 214, a light emitting side optical system 218, a light receiving side optical system 220, an image sensor 222, and a distance data processing unit 224. The surface emitting laser array 214 includes a light emission timing monitor 216.

The surface emitting laser array 214 is that the light emitting unit 110 of any one of the first to seventh embodiment is mounted on a package and includes a plurality of light emitting elements 112 arranged in a two-dimensional array. The surface emitting laser array 214 further includes a light emission timing monitor 216. The light emission timing monitor 216 corresponds to the light emission timing monitor 120 in the first to seventh embodiments. The electric signal generated by the light emission timing monitor 216 is supplied to the distance data processing unit 224. The surface emitting laser array driver 212 is a driving unit that receives a driving signal from the control unit 210, generates a driving current for oscillating the surface emitting laser array 214, and outputs the driving current to the surface emitting laser array 214. The surface emitting laser array 214 and the surface emitting laser array driver 212 may be one device.

The light emitting side optical system 218 is an optical system that emits the laser beam generated by the surface emitting laser array 214 toward a range to be measured. The light-receiving-side optical system 220 is an optical system that guides the laser beam reflected by an object-to-be-measured 1000 to the image sensor 222. Although the light emitting side optical system 218 and the light-receiving-side optical system 220 are represented by a single convex lens-shaped member in FIG. 23, the light emitting side optical system 218 and the light-receiving-side optical system 220 may be constituted by a single convex lens-shaped member, or may be constituted by a lens group formed by combining a plurality of lenses.

The image sensor 222 is a photoelectric conversion device in which a plurality of pixels including photoelectric conversion units are arranged in a two-dimensional array, and is a light receiving device that outputs an electric signal corresponding to incident light. The image sensor 222 may be, for example, a CMOS image sensor or an image sensor in which SPAD (Single Photon Avalanche Diode) optical sensors are arranged in a two-dimensional array. When the image sensor 222 is configured to separate the spontaneous emission light 88 from the light emitted from the first portion 82 of the light emitting element 112 as in the seventh embodiment, the image sensor 222 may have a function of the light emission timing monitor 216.

The distance data processing unit 224 has a function as a distance information acquisition unit that generates information on a distance to the object-to-be-measured 1000 existing in the range to be measured based on the electric signal received from the light emission timing monitor 216 and the image sensor 222, and outputs the information. The distance data processing unit 224 may have the function of the determination unit 130 in the first to seventh embodiments. The distance data processing unit 224 may be disposed in the same package as the image sensor 222, or may be disposed in a package different from the image sensor 222.

The control unit 210 includes a microcomputer, an information processing device including a logic circuit, and the like, and functions as a central processing device that controls the operation of the distance measuring device 200 such as the operation control of each unit and various calculation processes.

Next, an operation of the distance measuring device according to the present embodiment will be described with reference to FIG. 23.

First, the control unit 210 outputs a drive signal to the surface emitting laser array driver 212. The surface emitting laser array driver 212 receives a drive signal from the control unit 210 and injects a current of a predetermined current value into the surface emitting laser array 214. Thereby, the surface emitting laser array 214 oscillates, and laser beam is output from the surface emitting laser array 214. At this time, the pulse width of the light emitted from the surface emitting laser array 214 is narrower than the pulse width of the injected current, as described above.

The laser beam generated by the surface emitting laser array 214 is emitted toward the range to be measured by the light emitting side optical system 218. At this time, the spontaneous emission light 88 emitted from the surface emitting laser array 214 is incident on the light emission timing monitor 216. The light emission timing monitor 216 generates an electrical signal corresponding to the incidence of the spontaneous emission light 88 and outputs the electrical signal to the distance data processing unit 224. The distance data processing unit 224 detects the timing of laser oscillation in the surface emitting laser array 214 based on the electric signal received from the light emission timing monitor 216.

Among the laser beams applied to the object-to-be-measured 1000 in the range to be measured, the laser beams reflected by the object-to-be-measured 1000 and incident on the light receiving side optical system 220 are guided to the image sensor 222 by the light receiving side optical system 220. Each pixel of the image sensor 222 generates an electric signal pulse corresponding to the timing at which the laser beam is incident. The electric signal pulses generated by the image sensor 222 are input to the distance data processing unit 224.

The distance data processing unit 224 generates information on the distance to the object-to-be-measured 1000 along the light propagation direction based on the detected laser oscillation timing and the reception timing of the electric signal pulse output from the image sensor 222. By calculating distance information based on electric signal pulses output from each pixel of the image sensor 222, three-dimensional information of the object-to-be-measured 1000 can be acquired.

By configuring the distance measuring device 200 in this manner, even if the emission timing of the surface emitting laser array 214 deviates due to factors such as environmental temperature, high distance measuring accuracy can be maintained without affecting the distance measuring accuracy.

Next, the reason why the distance measuring device is configured in this manner in the present embodiment will be described with reference to FIG. 24 and FIG. 25.

In the LiDAR system, the distance to the object-to-be-measured is calculated based on the time difference from the emission of the laser beam to the return of the laser beam from the object-to-be-measured. Therefore, in order to improve the distance measurement accuracy, it is necessary to know the timing at which the light emitting element 112 generates the light emitting pulse with higher accuracy. For example, when the accuracy of time detection on the light-receiving side is about 50 psec, the accuracy of information on the timing of pulse generation on the light emitting side is preferably smaller than 50 psec.

In a general VCSEL and a LiDAR system using the same, a pulse current is generated by a VCSEL driver to drive the VCSEL. Since the VCSEL emits light in accordance with the pulse current waveform, the difference between the emission timing of the VCSEL and the rising timing of the pulse current generated in the VCSEL driver is small, and the time difference does not largely change due to a variation in the environmental temperature or the like. This is because the VCSEL is designed to emit light according to the injected current value. Therefore, it is possible to accurately estimate the time from the generation timing of the current pulse in the driver to the emission timing of the VCSEL.

On the other hand, the present inventors have found for the first time that when the time difference between the generation timing of the current pulse and the generation timing of the light pulse is estimated by the above-described method, the distance measurement accuracy may be reduced in the LiDAR system using the light emitting elements 112 of the first to seventh embodiments.

In the light emitting element 112 of the first to seventh embodiments, carriers are accumulated in the active layer 20, and the accumulated carriers are converted into light after the start of laser oscillation to generate light pulses. That is, the current injected into the light emitting element 112 is used to accumulate carriers in the active layer 20 for a predetermined period of time until carriers are accumulated in the active layer 20. Then, laser oscillation of the light emitting element 112 delays for the predetermined time until carriers are accumulated in the active layer 20.

The timing of laser oscillation in the semiconductor light emitting devices of the first to seventh embodiments is determined by the structure of the semiconductor light emitting device and the physical parameters of the materials constituting each part. Therefore, even if the current waveforms generated by the surface emitting laser array driver 212 are the same, the time difference from the start of driving to the start of laser oscillation changes due to a change in environmental temperature or a change in physical parameters over time. The time difference may exceed about 50 psec, which is a typical time detection accuracy on the light receiving side.

Figure 24:
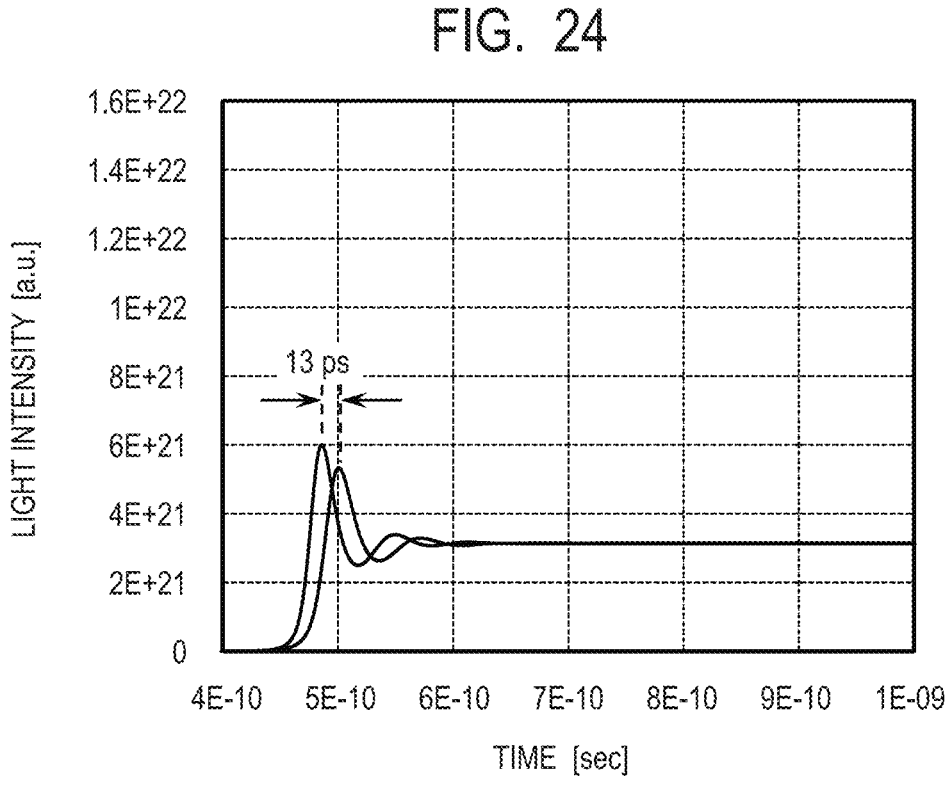
FIG. 24 is a graph illustrating a change in light waveform due to a change of an environmental temperature and temporal changes of physical parameters in a semiconductor light emitting device of a comparative example.
Figure 25:
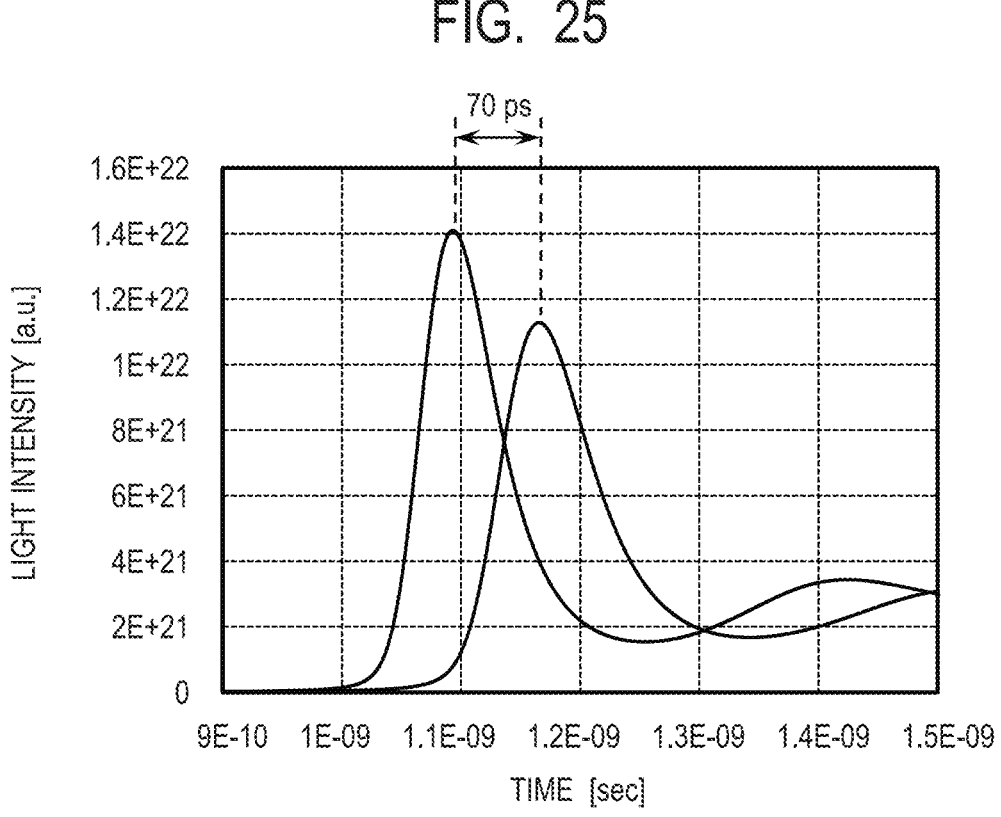
FIG. 25 is a graph illustrating a change in light waveform due to a change of an environmental temperature and temporal changes of physical parameters in a semiconductor light emitting device of the present invention.

FIG. 24 and FIG. 25 are graphs illustrating the results obtained by calculating the change in the light waveform due to the change in the environmental temperature and the change in the physical parameter over time. FIG. 24 illustrates calculation results in the case of a general VCSEL, and FIG. 25 illustrates calculation results in the case of the light emitting elements of the first to seventh embodiments.

FIG. 24 and FIG. 25 illustrate enlarged light waveforms immediately after the start of oscillation when the transparent carrier density is assumed at room temperature and when the transparent carrier density is assumed at 50° C. higher than room temperature. In any of the figures, the characteristic at which oscillation starts first is the case assuming the transparent carrier density at room temperature, and the characteristic at which oscillation starts later is the case assuming the transparent carrier density at 50° C. higher than room temperature.

In the general VCSEL, as illustrated in FIG. 24, the time difference between the peak of the light pulse when the transparent carrier density is assumed at room temperature and the peak of the light pulse when the transparent carrier density is assumed at 50° C. higher than room temperature is 13 psec.

On the other hand, in the light emitting element 112 of the above embodiment, as illustrated in FIG. 25, the time difference between the peak of the light pulse when the transparent carrier density is assumed at room temperature and the peak of the light pulse when the transparent carrier density is assumed at 50° C. higher than room temperature is 70 psec. The time difference from the timing at which the injection of current into the light emitting element 112 starts to the timing at which the light output reaches the maximum peak value may vary, for example, in a range of 50 psec or more and 1 nsec or less due to a change in the environmental temperature and the like.

As described above, in the light emitting element 112 of the above embodiment, the change in the physical property value greatly affects the change in the oscillation timing. The amount of change in the oscillation timing may exceed about 50 psec, which is a typical time detection accuracy on the light receiving side.

From such a viewpoint, in the distance measuring device 200 of the present embodiment, the emission timing of the surface emitting laser array 214 is detected by the light emission timing monitor 216. The distance information is calculated using the light emission timing detected by the light emission timing monitor 216. Therefore, even if the light emission timing of the surface emitting laser array 214 deviates due to factors such as the environmental temperature, it is possible to maintain high distance measurement accuracy without affecting the distance measurement accuracy of the distance measuring device 200.

The distance measuring device 200 of the present embodiment may be applied to, for example, a control device for performing control so as not to collide with other vehicles in the field of automobiles, a control device for performing control so as to follow the other vehicles and perform automatic driving, and the like. Further, the distance measuring device 200 of the present embodiment may be applied not only to an automobile but also to other movable objects (moving devices) such as a ship, an aircraft, and an industrial robot, a movable object detection system, and the like. The distance measuring device 200 of the present embodiment may be widely applied to a device that utilizes information of an object recognized three-dimensionally, including distance information. These movable objects may be configured to include the distance measuring device of the present embodiment and a control unit for controlling the movable object based on information about the distance acquired by the distance measuring device.

The three-dimensional information including the depth that can be acquired by the distance measuring device 200 of the present embodiment may also be used in an imaging device, an image processing device, a display device, and the like. For example, it is possible to display a virtual object on an image in the real world without discomfort by using three-dimensional information acquired by the distance measuring device 200 of the present embodiment. Further, by storing three-dimensional information together with image information, it is possible to correct a blurred taste or the like of a photographed image after photographing.

As described above, according to the present embodiment, it is possible to realize a high performance distance measuring device including the light source device of the first to seventh embodiments.

Modified Embodiments

The present invention is not limited to the above-described embodiments, and various modifications are possible.

For example, an example in which some of the configurations of any of the embodiments are added to other embodiments or an example in which some of the configurations of any of the embodiments are substituted with some of the configurations of the other embodiments is also an embodiment of the present invention.

Although GaAs, AlGaAs, and InGaAs are exemplified as semiconductor materials capable of crystal growth when a GaAs substrate is used as the semiconductor substrate 10 in the first to seventh embodiments, the semiconductor substrate 10 is not limited to the GaAs substrate. For example, an InP substrate may be used as the semiconductor substrate 10. Examples of a semiconductor material capable of crystal growth when the InP substrate is used as the semiconductor substrate 10 include InP, InGaAs, InGaP, InGaAsP, and the like.

The DBR layer in the semiconductor light emitting devices according to the first to seventh embodiments is not necessarily composed of a semiconductor material, and may be composed of a material other than a semiconductor material. Also in this case, the same effect as that of the present embodiment can be obtained by configuring to perform the same functions as those of the first and second embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-134111, filed Aug. 19, 2021, which is hereby incorporated by reference herein in its entirety.

What is claimed is:

1. A light source device comprising:

a light emitting element including a first reflector, a second reflector, and a resonator spacer portion provided between the first reflector and the second reflector and including an active layer, and emitting a first light as a laser beam and second light as a spontaneous emission light;

a light receiving element configured to determine a light amount of the second light; and a determination unit configured to determine a timing at which the first light oscillates based on a decrease in an amount of the second light determined by the light receiving element, wherein assuming that a distance between a light emitting portion of the second light of the light emitting element and a light receiving unit of the light receiving element is L, a total amount of the second light emitted from the light emitting element is P, an area of the light receiving unit is S, a sensitivity of the light receiving unit is Q, and a dark current of the light emitting element is Da, a following relationship is satisfied:

$$P \times (S/4\pi L^2) \times Q > Da.$$

2. The light source device according to claim 1, wherein the first light is emitted from a first portion of the light emitting element, and wherein the second light is emitted from a second portion different from the first portion of the light emitting element.

3. The light source device according to claim 1, wherein the light emitting element emits the first light in a first direction and the second light in a second direction intersecting the first direction.

4. The light source device according to claim 1, wherein the light emitting device further includes a wavelength filter configured to separate a third light emitted from the light emitting element into the first light and the second light.

5. The light source device according to claim 4, wherein the wavelength filter is a long-pass filter that transmits a light of a longer wavelength side than a wavelength λco and reflects a light of a shorter wavelength side than the wavelength λco, and the wavelength λco has a following relationship where λc represents a resonance wavelength of the first light:

$$\lambda co < \lambda c - 5 \text{ [nm]}.$$

6. The light source device according to claim 4, wherein the wavelength filter is a long-pass filter that transmits a light of a longer wavelength side than a wavelength λco and reflects a light of a shorter wavelength side than the wavelength λco, and the wavelength λco has a following relationship where λc represents a resonance wavelength of the first light:

$$\lambda co \leq \lambda c - 30 \text{ [nm]}.$$

7. The light source device according to claim 1, wherein the light emitting element is configured to emit the first light having a maximum peak value and having a profile that converges after the maximum peak value to a stable value that is a predetermined light intensity, and wherein the maximum peak value is equal to or greater than three times the stable value.

8. The light source device according to claim 1, wherein the determination unit determines that the first light is oscillated in response to a differential value of the amount of the second light with respect to time being equal to or less than a predetermined threshold value.

9. The light source device according to claim 1, wherein the determination unit determines that the first light is oscillated at a timing when a second-order differential value with respect to time of the amount of the second light becomes a peak.

10. The light source device according to claim 1, wherein the determination unit predicts a timing at which the first light oscillates based on a lookup table indicating a relationship between a delay time of a peak time of the first light with respect to a peak time of the second light and environmental information.

11. The light source device according to claim 1 further comprising a light shielding film configured to prevent the first light from entering the light receiving element provided between the light emitting element and the light receiving element.

12. The light source device according to claim 1 further comprising a wavelength filter that does not transmit a wavelength region of the first light provided between the light emitting element and the light receiving element.

13. The light source device according to claim 1, wherein the light emitting element further includes a saturable absorption layer provided between the first reflector and the second reflector.

14. The light source device according to claim 1, wherein the light emitting element is a vertical cavity surface emitting laser element.

15. The light source device according to claim 1, wherein the light receiving element includes a light receiving unit having the same configuration as the active layer.

16. A distance measuring device comprising:

the light source device according to claim 1;

a light receiving device configured to receive a light emitted from the light source device and reflected by an object-to-be-measured; and a distance information acquisition unit that acquires information on a distance to the object-to-be-measured based on a time difference between a timing at which the first light is emitted from the light source device and a timing at which the light receiving device receives the first light.

17. A movable object comprising:

a distance measuring device according to claim 16; and a control unit configured to control the movable body based on the information on the distance acquired by the distance measuring device.

* * * * *